US012727243B2

(12) United States Patent
Kang et al.

(10) Patent No.: US 12,727,243 B2
(45) Date of Patent: Sep. 1, 2026

(54) BACKSIDE DIFFUSION BREAK

(71) Applicant: INTERNATIONAL BUSINESS MACHINES CORPORATION, Armonk, NY (US)

(72) Inventors: Tsung-Sheng Kang, Ballston Lake, NY (US); Sagarika Mukesh, Albany, NY (US); Ruilong Xie, Niskayuna, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 358 days.

(21) Appl. No.: 18/405,441

(22) Filed: Jan. 5, 2024

(65) Prior Publication Data

US 2025/0227997 A1 Jul. 10, 2025

(51) Int. Cl.

*H10D 86/01* (2026.01)
*H10W 10/00* (2026.01)
*H10W 10/17* (2026.01)

(52) U.S. Cl.

CPC ...... *H10D 86/0214* (2025.01); *H10W 10/014* (2026.01); *H10W 10/17* (2026.01)

(58) Field of Classification Search

CPC ....... H10D 30/501–509; H10D 62/116; H10D 62/115; H10D 62/113

See application file for complete search history.

(56) References Cited

U.S. PATENT DOCUMENTS

| | | | | |
|---|---|---|---|---|
| 9,406,676 | B2 | 8/2016 | Yu | |
| 9,412,616 | B1 * | 8/2016 | Xie | H10D 64/017 |
| 9,589,845 | B1 | 3/2017 | Jagannathan | |
| 9,935,104 | B1 | 4/2018 | Wang | |
| 10,388,519 | B2 | 8/2019 | Smith | |
| 10,388,652 | B2 | 8/2019 | Shi | |
| 10,665,669 | B1 * | 5/2020 | Xie | H10D 30/6735 |
| 10,784,342 | B1 * | 9/2020 | Hong | H10D 62/116 |
| 11,195,911 | B2 * | 12/2021 | Xie | H10D 62/116 |
| 2017/0141211 | A1 * | 5/2017 | Xie | H10D 64/017 |
| 2020/0098858 | A1 * | 3/2020 | Yang | H10D 62/115 |
| 2020/0402838 | A1 * | 12/2020 | Gu | H10D 84/0151 |
| 2022/0302172 | A1 * | 9/2022 | Hong | H10D 30/6735 |
| 2023/0123883 | A1 | 4/2023 | Ruilong | |
| 2023/0178437 | A1 | 6/2023 | Xie | |

(Continued)

OTHER PUBLICATIONS

"Novel Postgate Single Diffusion Break Integration in Gate-All-Around Nanosheet Transistors to Achieve Remarkable Channel Stress for N/P Current Matching" bu Liu et al. (Year: 2022).*

*Primary Examiner* — Evren Seven

(74) *Attorney, Agent, or Firm* — Seed Intellectual Property Law Group LLP

(57) ABSTRACT

A semiconductor integrated circuit (IC) device includes a diffusion break region that has a diffusion break dielectric adjacent to or between diffusion break isolation wall(s). The diffusion break region may separate adjacent transistors. The diffusion break isolation wall(s) may include respective retained portions of a backside spacer, a bottom isolation, respective inner spacers, and residual active semiconductor nanolayers. The diffusion break region may be fabricated by depositing a diffusion break dielectric within a diffusion break opening against the diffusion break isolation wall(s).

19 Claims, 15 Drawing Sheets

(56) References Cited

U.S. PATENT DOCUMENTS

| | | | | |
|---|---|---|---|---|
| 2024/0154009 | A1* | 5/2024 | Li | H10D 30/6729 |
| 2024/0312912 | A1* | 9/2024 | Vega | H10D 30/43 |
| 2025/0081598 | A1* | 3/2025 | Tsai | H10D 84/83 |
| 2025/0194168 | A1* | 6/2025 | Kang | H10W 10/021 |
| 2025/0309116 | A1* | 10/2025 | Zhang | H10W 20/427 |
| 2025/0311273 | A1* | 10/2025 | Yeung | H10D 30/43 |

* cited by examiner

BACKSIDE DIFFUSION BREAK

BACKGROUND

In modern semiconductor integrated circuit (IC) device fabrication, transistor devices that are formed within the semiconductor IC device are electrically isolated from one another to promote proper function in an electrical circuit. Typically, this is accomplished by forming a trench from the frontside of the semiconductor IC device within the substrate, and filling the trench with an insulating material, such as silicon dioxide. Within the industry, these isolation regions may sometimes be referred to as "diffusion breaks." In some applications, such as semiconductor IC devices employing GAA FETs, it may be difficult to form diffusion breaks as device sizes have decreased and packing densities have increased.

SUMMARY

In an embodiment of the disclosure, a semiconductor integrated circuit (IC) device is presented. The semiconductor IC device includes a first diffusion break isolation wall and a diffusion break dielectric directly against an outer sidewall of the first diffusion break isolation wall. The first diffusion break isolation wall includes a backside spacer, a bottom isolation region directly upon the backside spacer, an alternating series of residual nanolayer channel layers and residual inner spacers directly upon the bottom isolation region, and a gate spacer directly upon the alternating series of residual nanolayer channel layers and residual inner spacers.

In an embodiment of the disclosure, another semiconductor IC device is presented. The semiconductor IC device includes a first diffusion break isolation wall and a diffusion break dielectric directly against an outer sidewall of the first diffusion break isolation wall. The first diffusion break isolation wall includes a backside spacer, an alternating series of residual nanolayer channel layers and residual inner spacers directly upon the backside spacer, and a gate spacer directly upon the alternating series of residual nanolayer channel layers and residual inner spacers.

In another embodiment, a semiconductor IC device fabrication method is presented. The method includes forming a diffusion break opening by removing a replacement gate and active semiconductor nanolayers from a backside of the semiconductor IC device. The method further includes depositing a diffusion break dielectric within the diffusion break opening.

The above summary is not intended to describe each illustrated embodiment or every implementation or example of the present disclosure.

BRIEF DESCRIPTION OF THE DRAWINGS

The drawings included in the disclosure are incorporated into, and form part of, the specification. They illustrate embodiments of the present disclosure and, along with the description, explain the principles of the disclosure. The drawings are only illustrative of certain embodiments and do not limit the disclosure.

FIG. 4 through FIG. 14 depict various fabrication structure cross-section views of an illustrative semiconductor IC device that includes a diffusion break dielectric between diffusion break isolation walls, according to one or more embodiments of the disclosure.

DETAILED DESCRIPTION

Figure 1:
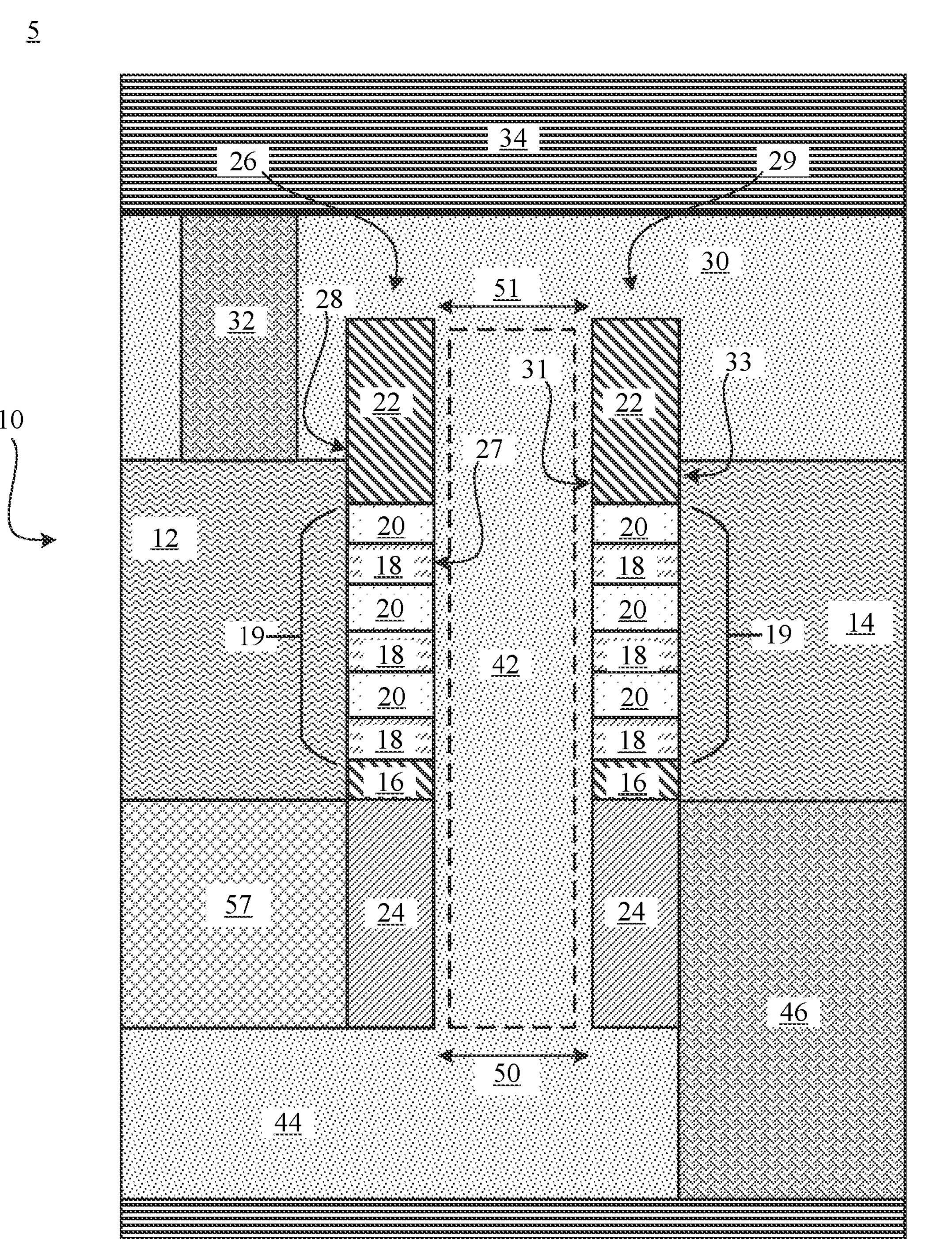
FIG. 1 and FIG. 2 depict respective cross-section views of a semiconductor IC device that includes a diffusion break dielectric adjacent to and/or between diffusion break isolation wall(s), according to one or more embodiments of the disclosure.

The embodiments of the present disclosure relate to fabrication methods and resulting structures for semiconductor devices. More specifically, the present disclosure relates to fabrication methods and resulting semiconductor integrated circuit (IC) devices that include a diffusion break region that includes a diffusion break dielectric adjacent to or between diffusion break isolation wall(s). The diffusion break region may separate adjacent transistors, such as GAA FETs. The diffusion break region may be fabricated by removing the substrate structure underneath the gate spacer, inner spacers, and replacement gate and between backside contact placeholders of the GAA FET. The diffusion break region may be further fabricated by forming one or more backside spacer(s) underneath the gate spacer and/or inner spacers. The diffusion break region may be further fabricated by forming a diffusion break opening by utilizing the backside spacer(s) as an etch mask and removing the bottom isolation (if present), the replacement gate, and the active semiconductor nanolayers from the backside of the semiconductor IC device. The diffusion break isolation wall(s) may include respective retained portions of the backside spacer(s), the bottom isolation (if present), the inner spacers, and the active semiconductor nanolayers. The diffusion break region may further be fabricated by depositing the diffusion break dielectric within the diffusion break opening against the diffusion break isolation wall(s).

A transistor is a type of microdevice that may be fabricated in semiconductor IC device front-end-of-line (FEOL) fabrication operations. Conventional transistors, or the like, incorporate planar field effect transistors (FETs) in which current flows through a semiconducting channel between a source and a drain, in response to a voltage applied to the gate. The semiconductor industry strives to obey Moore's law, which holds that each successive generation of integrated circuit devices shrinks to half its size and operates twice as fast. As device dimensions have shrunk, however, conventional silicon device geometries and materials have had trouble maintaining switching speeds without incurring failures such as, for example, leaking current from the device into the semiconductor substrate. Several new technologies emerged that allowed chip designers to continue shrinking transistor sizes. A FET generally is a transistor in which output current, i.e., source-drain current, is controlled by a voltage applied to an associated gate. A FET typically has three terminals, i.e., a gate structure, a source region, and a drain region. A gate structure is a structure used to control output current (i.e., flow of carriers in the channel) of a semiconducting device through electrical or magnetic fields. A channel is the region of the FET underlying the gate structure and between the source and drain of the semiconductor IC device that becomes conductive when the semiconductor device is turned on. The source is a doped region in the semiconductor IC device, in which majority carriers are flowing into the channel. A drain is a doped region in the semiconductor IC device located at the end of the channel, in which carriers are flowing out of the transistor through the drain.

One technology change modified the structure of the FET from a planar device to a three-dimensional device in which the semiconducting channel was replaced by a fin that extends out from the plane of the substrate. In such a device, commonly referred to as a FinFET, the control gate wraps around three sides of the fin to influence current flow from three surfaces instead of one. The improved control achieved with a 3D design results in faster switching performance and reduced current leakage. Building taller devices has also permitted increasing the device density within the same footprint that had previously been occupied by a planar FET.

The FinFET concept was further extended by developing a gate all-around FET, or GAA FET, in which the gate fully wraps around one or more channels for maximum control of the current flow therein. In the GAA FET, the channels can take the form of nanolayers, nanosheets, or the like, that are isolated from the substrate. In the GAA FET, channel surfaces are in respective contact with the source and drain and other respective channel surfaces are in contact with and surrounded by the gate.

The flowcharts and cross-sectional diagrams in the drawings illustrate a method of fabricating a semiconductor IC device, such as a processor, filed programmable gate array (FPGA), memory module, or the like. In some alternative implementations, the fabrication steps may occur in a different order than that which is noted in the drawings, and certain additional fabrication steps may be implemented between the steps noted in the drawings. Moreover, any of the layered structures depicted in the drawings may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" if the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the depicted structure(s) as oriented. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, ±2%, or the like, difference between the coplanar materials.

As used herein, the term "coplanar" refers to two surfaces that lie in a common plane. In other words, two surfaces are coplanar if there exists a geometric plane that contains all the points of both of the surfaces. Accordingly, two surfaces may be referred to as substantially coplanar despite deviations from coplanarity, so long as those deviations do not impact the desired result of the coplanarity.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, e.g., 5:1, 10:1 or 20:1.

For the sake of brevity, conventional techniques related to semiconductor IC device fabrication may or may not be described in detail and/or depicted herein. Moreover, the various tasks and process steps described herein can be incorporated into a more comprehensive procedure or process having additional steps or functionality not described and/or not depicted in detail herein. Various steps in the manufacture of semiconductor devices are well known and so, in the interest of brevity, many conventional steps will only be mentioned briefly herein, will be omitted entirely without providing the well-known process details, and/or will not be depicted.

In general, the various processes used to form a semiconductor IC device that may be packaged into an IC package fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, a metal-oxide-semiconductor field-effect transistor (MOSFET) may be used for amplifying or switching electronic signals. The MOSFET has a source electrode, a drain electrode, and a metal oxide gate electrode. The metal gate portion of the metal oxide gate electrode is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (nFET) and p-type field effect transistors (pFET) are two types of complementary MOSFETs. The nFET includes n-doped source and drain regions and uses electrons as the charge carrier. The pFET includes p-doped source and drain regions and uses holes as the charge carrier. Complementary metal oxide semiconductor (CMOS) is a technology that uses complementary and symmetrical pairs of p-type and n-type MOSFETs to implement logic functions. As mentioned above, hole mobility on the pFET may have an impact on overall device performance.

The wafer footprint of a FET is related to the electrical conductivity of the channel material. If the channel material has a relatively high conductivity, the FET can be made with a correspondingly smaller wafer footprint. A method of increasing channel conductivity and decreasing FET size is to form the channel as a nanostructure, such as a nano wire, nano ribbon, nanolayer, nanosheet, or the like, hereinafter referred to as a nanolayer. For example, a GAA FET provides a relatively small FET footprint by forming the channel region as a series of vertically stacked nanolayers. In a GAA configuration, a GAA FET includes a source region, a drain region and vertically stacked nanolayer channels between the source and drain regions. These devices typically include one or more suspended nanolayers that serve as the channel. A gate surrounds the stacked nanolayers and regulates electron flow through the nanolayers between the source and drain regions. GAA FETs may be fabricated by forming alternating layers of active nanolayers and sacrificial nanolayers. The sacrificial nanolayers are released from the active nanolayers before the FET device is finalized. For n-type FETs, the active nanolayers are typically silicon (Si) and the sacrificial nanolayers are typically silicon germanium (SiGe). For p-type FETs, the active nanolayers can be SiGe and the sacrificial nanolayers can be Si. In some implementations, the active nanolayers of a p-type FET can be SiGe or Si, and the sacrificial nanolayers can be Si or SiGe. Forming the nanolayers from alternating layers of active nanolayers formed from a first type of semiconductor material (e.g., Si for n-type FETs, and SiGe for p-type FETs) and sacrificial nanolayers formed from a second type of semiconductor material (e.g., SiGe for n-type FETs, and Si for p-type FETs) may provide for superior channel electrostatics control, which is necessary for continuously scaling gate lengths.

For some semiconductor IC devices, integration of microdevices with a backside back-end-of-line (BEOL) network is one of the key challenges to providing increasing packaged IC device densities and performance increases. By incorporating a backside BEOL network into the semiconductor IC device, routing congestion may be eased. Currently, there is a need for semiconductor IC device microdevice fabrication stages that integrate with and/or utilize the fabrication stages that form the backside BEOL network.

Referring now to the figures, FIG. 1 depicts a cross-sectional view of an illustrative semiconductor integrated circuit (IC) device 5 which includes a diffusion break dielectric 42 adjacent to and/or between a first diffusion break isolation wall 26 and/or a second diffusion break isolation wall 29. For example, the diffusion break dielectric may be against an outer sidewall 27 of the first diffusion break isolation wall 26.

Both the first diffusion break isolation wall 26 and the second diffusion break isolation wall 29 may include a backside spacer 24, a bottom isolation region 16 directly upon the backside spacer 24, an alternating series 19 of residual nanolayer channel layers 20 and residual inner spacers 18 directly upon the bottom isolation region 16, and a gate spacer 22 directly upon the alternating series 19 of residual nanolayer channel layers 20 and residual inner spacers 18.

The semiconductor IC device 5 may further include a transistor 10 and/or a transistor 40. Transistor 10 may include a source/drain (S/D) region 12, one or more nanolayer channels (not shown), another S/D region (not shown), and a gate. Similarly, transistor 40 may include a source/drain (S/D) region 14, one or more nanolayer channels (not shown), another S/D region (not shown), and a gate.

In an example, the backside spacer 24 of the first diffusion break isolation wall 26 is directly against a sidewall of a backside contact placeholder 57 of the transistor 10. In an example, a bottom surface of the backside spacer 24 of the first diffusion break isolation wall 26 is substantially coplanar with a bottom surface of the backside contact placeholder 57. This may result from a planarization process, such as a chemical mechanical polish (CMP) planarizing such surfaces.

In an example, an inner sidewall 28 of the first diffusion break isolation wall 26 is directly against a sidewall of the S/D region 12. This may result due to the S/D region 12 being formed against the backside contact placeholder 57 and against the features of the inner sidewall 28 prior to the formation of the diffusion break dielectric 42. In an example, a bottom surface of the S/D region 12 is directly against a top surface of the backside contact placeholder 57. This may result from epitaxial growth of the S/D region 12 from the top surface of the backside contact placeholder 57.

In an example, charge carriers do not flow through the residual nanolayer channel layers 20. This may result from a conductive gate, previously associated with the nanolayer channel layers, being removed, and replaced by the diffusion break dielectric 42. In other words, the residual nanolayer channel layers 20 may not be in contact with or otherwise associated with a gate, or like structure, that causes charge carries, such as electrons or holes, to flow there across.

In an example, the semiconductor IC device 5 also includes a frontside interlayer dielectric (ILD) 30 upon the S/D region 12, upon the gate spacer 22 of the first diffusion break isolation wall 26, and upon the diffusion break dielectric 42. In the example, the semiconductor IC device 5 also includes a backside ILD 44 upon the backside contact placeholder 57, upon the backside spacer 24 of the first diffusion break isolation wall 26, and upon the diffusion break dielectric 42.

In an example, the backside ILD 44 and the diffusion break dielectric 42 are composed of a same first dielectric material. For example, the backside ILD 44 and the diffusion break dielectric 42 are simultaneously formed in the same material deposition process from the backside of the semiconductor IC device 5.

In an example, the frontside ILD 30 is composed of a second dielectric material different from the first dielectric material. For example, the dielectric material of the backside ILD 44 and the diffusion break dielectric 42 may be chosen to achieve a predetermined electrical isolation metric between the first transistor 10 and the second transistor 40 that the dielectric material of frontside ILD 30 could not achieve if utilized.

In an example, the semiconductor IC device 5 may further include a second diffusion break isolation wall 29. In this example, the diffusion break dielectric 42 may be further directly against an outer sidewall 31 of the second diffusion break isolation wall 29.

In an example, a bottom surface of the backside spacer 24 of the second diffusion break isolation wall 29 is substantially coplanar with a bottom surface of the backside contact placeholder 57. This may result from a planarization process, such as a chemical mechanical polish (CMP) planarizing such surfaces.

In an example, an inner sidewall 33 of the second diffusion break isolation wall 29 is directly against a sidewall of the S/D region 14. This may result due to the S/D region 14 being formed against a substrate and against the features of the inner sidewall 33 prior to the formation of the diffusion break dielectric 42.

In an example, a dimension 50 between a bottom surface of the backside spacer 24 of the first diffusion break isolation wall 26 and a bottom surface of the backside spacer 24 of the second diffusion break isolation wall 29 is substantially the same as a dimension 51 between a top surface of the gate spacer 22 of the first diffusion break isolation wall 26 and a top surface of the gate spacer 22 of the second diffusion break isolation wall 29. This may result from a directional etch, such as a reactive ion etch, to form an opening associated with the diffusion break dielectric 42 from the backside of the semiconductor IC device 5. In another example, the dimension 50 is greater than the dimension 51. This may result from a wet etch to form the opening associated with the diffusion break dielectric 42 from the backside of the semiconductor IC device 5.

In an example, as opposed to the first backside spacer 24, within the diffusion break isolation wall 26, being directly against the sidewall of the backside contact placeholder 57, the first backside spacer 24 may alternatively be directly against a sidewall of a backside contact 46, as illustrated by the backside spacer 24 within diffusion break isolation wall 29.

Figure 2:
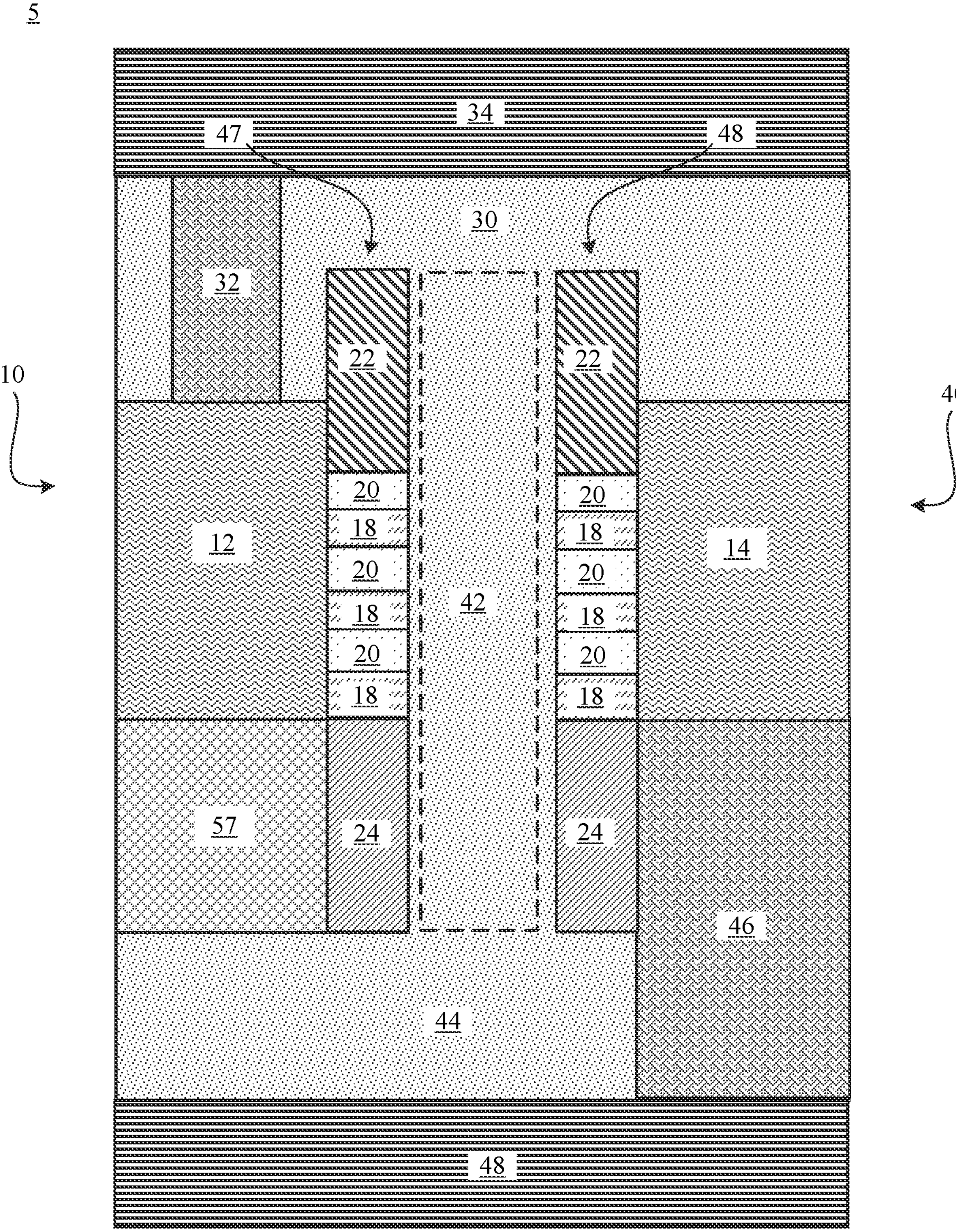

FIG. 2 depicts a cross-sectional view of the semiconductor IC device 5 that includes a diffusion break dielectric 42 adjacent to and/or between relatively different diffusion break isolation walls relative to the semiconductor IC device depicted in FIG. 1. As depicted, the semiconductor IC device 5 includes a first diffusion break isolation wall 47 and/or a second diffusion break isolation wall 48. The first diffusion break isolation wall 47 is like the first diffusion break isolation wall 26 except for the bottom isolation region 16 being omitted in the first diffusion break isolation wall 47. Likewise, the second diffusion break isolation wall 48 is like the second diffusion break isolation wall 29 except for the bottom isolation region 16 being omitted in the second diffusion break isolation wall 48.

In an example, the semiconductor IC device 5 may be formed by a fabrication method. The fabrication method may include forming a diffusion break opening by removing a replacement gate and active semiconductor nanolayers from a backside of the semiconductor IC device 5. The fabrication method may further include depositing a diffusion break dielectric within the diffusion break opening.

Figure 3:
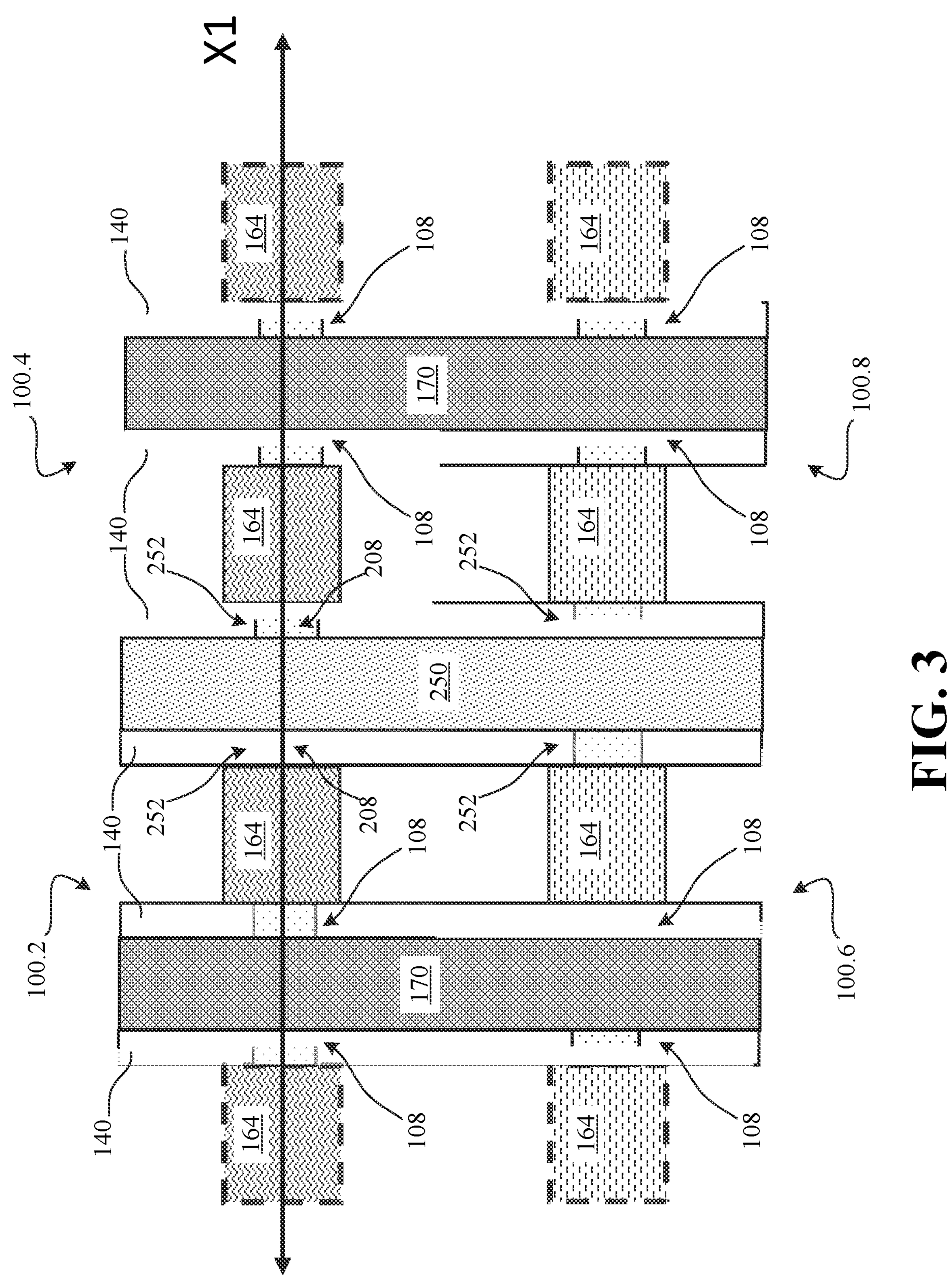
FIG. 3 depicts a partial structure top-down view of an illustrative semiconductor IC device that includes a diffusion break dielectric between diffusion break isolation walls, according to one or more embodiments of the disclosure.

FIG. 3 depicts a partial structural top-down view of a semiconductor IC device 100 that includes a transistor 100.2 and transistor 100.4. The semiconductor IC device 100 may further include a transistor 100.6 and transistor 100.8.

Each transistor 100.2, 100.4, 100.6, 100.8, or the like, may include a series of vertically stacked channels (e.g., a plurality of active semiconductor nanolayers 108 vertically stacked in various planes into and/or out of the page) between a respective source and/or drain (S/D) region (e.g., S/D regions 164) and a replacement gate structure 170. Transistor 100.2 and transistor 100.6 may share a replacement gate structure 170 that includes a conductive gate that is around and that contacts the series of vertically stacked channels of transistors 100.2, 100.6, respectively. Similarly, transistor 100.4 and transistor 100.8 may share a distinct replacement gate structure 170 that includes a conductive gate that is around and that contacts the series of vertically stacked channels of transistors 100.4, 100.8, respectively.

A gate spacer 140 may contact and be against the replacement gate structure 170. In examples and as depicted, the S/D regions 164 within the transistor 100.2 and transistor 100.4 may be of the same type and may further be the opposite type relative to those S/D regions 164 within the transistors 100.6, 100.8. Each replacement gate structure 170 may be electrically connected to a respective frontside wire within frontside BEOL network by way of at least a frontside contact.

Transistor 100.2 and transistor 100.4 may be separated (e.g., adequately electrically isolated) by at least a diffusion break dielectric 250 that is formed from the backside of the semiconductor IC device 5. The diffusion break dielectric 250 may be against and/or between respective diffusion break isolation walls 252. As depicted, front and rear surfaces of the diffusion break isolation walls 252 may be inset within respective front and rear surfaces of the associated S/D regions 164. For example, the footprint of respective perimeters of one or more of the residual nanolayer channel layers 208 may define the bottom and/or top surface perimeter dimension(s) of the associated diffusion break isolation wall 252.

Residual nanolayer channel layers 208 may be located within the one or more diffusion break isolation walls 252. The residual nanolayer channel layers 208 may be vertically stacked in various planes into and/or out of the page between a respective S/D region 164 and the diffusion break dielectric 250. Charge carriers generally do not flow through the residual nanolayer channel layers 208. This may result from the diffusion break dielectric 250 being formed in place of a previously existing replacement gate structure 170. In other words, the residual nanolayer channel layers 208 may not be in contact with or otherwise associated with a gate, or like structure, that causes charge carries, such as electrons or holes, to flow there across.

FIG. 3 also depicts a cross-sectional plane X1, which is a vertical plane across various replacement gate structures 170, across respective S/D region(s) 164 of transistor 100.2 and/or 100.4, across diffusion break isolation wall(s) 252, and across the diffusion break dielectric 250. The cross-sectional plane X1 establishes the cross-sectional views of FIG. 4 through FIG. 14 of the various fabrication structure cross-sectional views of the semiconductor IC device 100.

Figure 4:
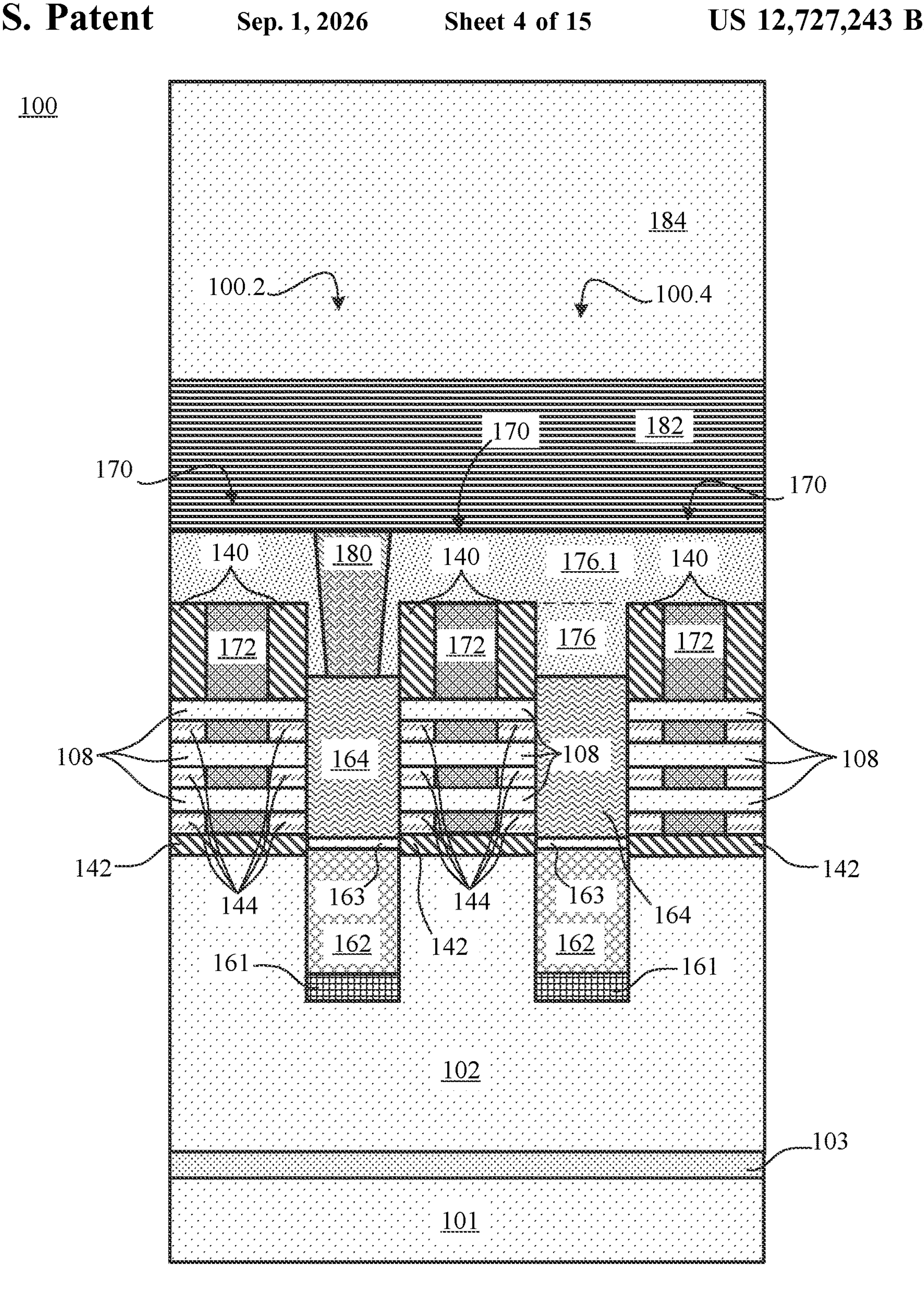

FIG. 4 depicts a cross-sectional initial fabrication view of the semiconductor IC device 100 that is to include a diffusion break dielectric between diffusion break isolation walls. At this initial fabrication stage, the semiconductor IC device 100 may include a lower substrate 101, an etch stop layer 103, an upper substrate 102, STI regions (not shown in the depicted cross-section), backside contact placeholders 162, etch stop layers 163, placeholder protective caps 161, S/D regions 164, a frontside ILD 176, a frontside contact ILD 176.1, one or more frontside contact(s) 180, a frontside BEOL network 182, and a carrier wafer 184.

Figure 10:
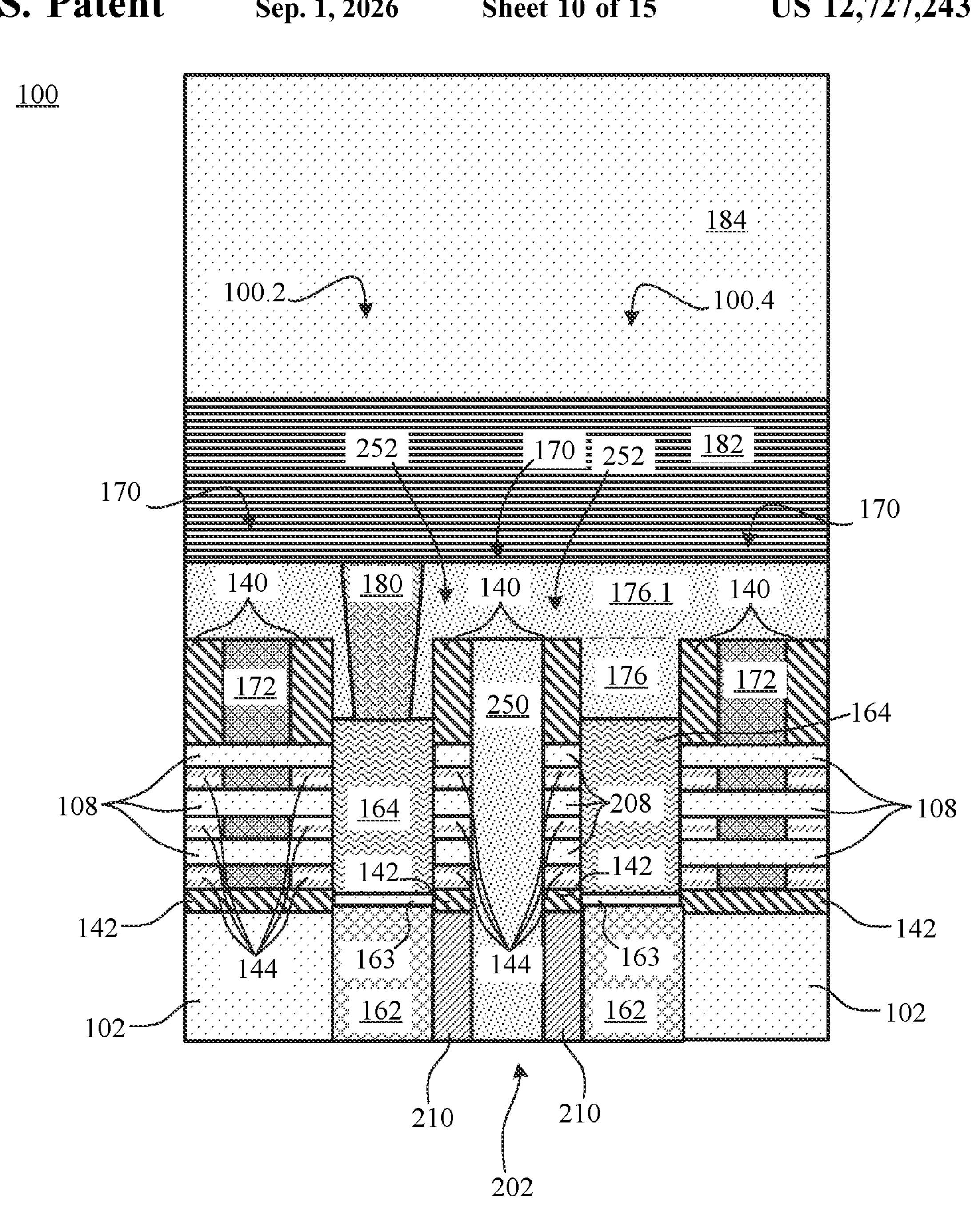

For clarity, at the present fabrication stage, a particular S/D region 164 of transistor 100.2 is depicted and a particular S/D region 164 of transistor 100.4 is depicted. Also depicted is a particular replacement gate structure 170 that subsequently may be removed and replaced by the diffusion break dielectric 250, as depicted in FIG. 10.

For clarity, various background fabrication stages are described below that may be used to form the depicted semiconductor IC device 100. These background fabrication stages may reference structures that are not shown in the present cross-section, but descriptions of the formation thereof are included herein to more fully enable the illustrated semiconductor IC device 100.

The illustrative semiconductor IC device 100 may be formed by initially providing or forming a substrate structure. The substrate structure may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon (Si) is the predominantly used semiconductor material in wafer fabrication, alternative semiconductor materials can be employed, such as, but not limited to, gallium arsenide, gallium nitride, cadmium telluride, zinc selenide, and III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

In the depicted implementation, the substrate structure includes an upper substrate 102, a lower substrate 101, and an etch stop layer 103 between the upper substrate 102 and the lower substrate 101. The upper substrate 102 and the lower substrate 101 may be comprised of any suitable material(s) including those listed above, and the etch stop layer 103 may be a dielectric material with etch selectivity to one or both of the upper substrate 102 and/or the lower substrate 101. In one example, the etch stop layer 103 may be an oxide and the substrate structure may be referred to as a buried oxide (BOX) substrate. In another example, the lower substrate 101 may be composed of Si. The etch stop layer 103 may be composed of Silicon Germanium (SiGe) and may be epitaxially grown from the top surface of lower substrate 101 and the upper substrate 102 may be composed of Si and may be epitaxially grown from the top surface of etch stop layer 103.

Next, the illustrative semiconductor IC device 100 may be formed by forming nanolayers over the substrate structure by forming a bottommost sacrificial nanolayer (not shown) and by forming a series of alternating sacrificial nanolayers (not shown) and active nanolayers 108, thereupon. In certain examples, the bottommost sacrificial nanolayer is initially formed directly on an upper surface of the substrate structure. In other examples, certain layer(s) may be formed between the upper surface of the substrate structure and the bottommost sacrificial nanolayer. In an example, the bottommost sacrificial nanolayer may be formed by epitaxially growing a SiGe layer with a relatively high percentage of Ge, ranging from 50% to 70%. The bottommost sacrificial nanolayer may have etch selectivity relative to the sacrificial nanolayers and active nanolayers 108.

The nanolayers may be further formed by fabricating the alternating series of sacrificial nanolayers, such as SiGe sacrificial nanolayers, and active nanolayers 108, such as Si nanolayers, upon the bottommost sacrificial nanolayer. The sacrificial nanolayers can have Ge percentages ranging from 20% to 45%. In an implementation, the alternating active sacrificial nanolayer and active nanolayer 108 may be formed by epitaxially growing each layer until the desired number and desired thicknesses of the layers are achieved. Any number of alternating nanolayers can be provided. Epitaxial materials can be grown from gaseous or liquid precursors. For example, epitaxial materials can be grown using vapor-phase epitaxy (VPE), molecular-beam epitaxy (MBE), liquid-phase epitaxy (LPE), or other suitable processes.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a (100) orientated crystalline surface will take on a (100) orientation. In some embodiments, epitaxial growth and/or deposition processes are selective to forming on semiconductor surfaces, and generally do not deposit material on exposed surfaces, such as silicon dioxide or silicon nitride surfaces.

It should be appreciated that any suitable number of alternating nanolayers may be formed. Although it is specifically contemplated that the bottommost sacrificial nanolayer and the sacrificial nanolayers can be formed from SiGe and that the active nanolayers 108 can be formed from Si, it should be understood that any appropriate materials can be used instead, as long as the semiconductor materials have etch selectivity with respect to one or more of the others, as is consistent with the description of the fabrication stages herein.

Although it is specifically contemplated that the bottommost sacrificial nanolayer, the sacrificial nanolayers, and the active nanolayers 108 are formed by epitaxial growth, such nanolayers can be formed by any appropriate mechanism, such as chemical vapor deposition (CVD), physical vapor deposition (PVD), atomic layer deposition (ALD), or gas cluster ion beam (GCIB) deposition, or the like.

In certain embodiments, the nanolayers have a vertical thickness ranging, for example, from approximately 3 nm to approximately 20 nm. In certain embodiments, the nanolayers have a vertical thickness ranging, for example, from approximately 3 nm to approximately 10 nm. Although the range of 3-20 nm is cited as an example range of thickness of the nanolayers, other thickness of these nanolayers may be used. In certain examples, certain of the nanolayers may have different thicknesses relative to one another. In certain examples, it may be desirable to have a small vertical spacing (VSP) between adjacent active nanolayers 108 to reduce the parasitic capacitance and to improve circuit speed. For example, the VSP (the distance between vertically adjacent active nanolayers 108) may range from 5 nm to 15 nm. However, the VSP must be of a sufficient value to accommodate the formation of a gate that is to be formed in the spaces created by later removal of respective portions of the sacrificial nanolayers.

Further, in the depicted fabrication stages, the nanolayers may be patterned into nanolayer stacks and shallow trench isolation (STI) regions may be formed within the substrate structure adjacent to the nanolayer stacks.

To form one or more nanolayer stacks, a mask layer (not shown) may be formed on the uppermost nanolayer. The mask layer may be comprised of any suitable mask material (s). The mask layer may be patterned and used to perform the nanolayer stack patterning process. In the nanolayer stack patterning process, any suitable material removal process (e.g., reactive ion etching or RIE) may be used to remove portions of the alternating nanolayers down to the level of the substrate structure, or the like. Following the nanolayer stack patterning process, the one or more nanolayer stacks are formed. Subsequently, the mask layer may be removed.

The removal of undesired portion(s) of the nanolayers may further remove undesired portions of substrate structure that are adjacent to respective footprints of nanolayer stacks to form STI region openings. The etch may be timed or otherwise controlled to stop the removal of the substrate structure such that the depth or bottom of the one or more STI region openings has a predetermined or desired dimension. For example, the depth or bottom of the one or more STI region openings may be above the etch stop layer 103. In some examples, the etch to form the nanolayer stacks may utilize the etch stop layer 103 to stop the etch and form the bottom well of the one or more STI region openings.

A STI region (not shown) may be formed upon and/or within the substrate structure within respective STI region openings. The STI regions may be formed by depositing electrical dielectric material(s) within respective STI region opening(s) that are adjacent to the one or more nanolayer stacks. A top surface of the one or more STI regions may be initially coplanar with or below a top surface of the substrate structure. In some implementations, further fabrication operations may generally remove portions of the STI regions (e.g., sacrificial gate removal, replacement gate fabrication pre-clean, etc.), such that the top surfaces of the STI regions are below the top surface of the substrate structure.

The one or more STI regions may have a volume and/or geometry that sufficiently electrically isolates components or features of neighboring transistors 100.2, 100.4, 100.6, 100.8, and 100.10, or the like, may sufficiently electrically isolate neighboring nanolayer stacks. For clarity, a particular STI region may separate and adequately electrically isolate neighboring transistors 100.2, 100.6 and/or 100.4, 100.8.

In an example, the STI region(s) may be formed by depositing a STI liner within the STI region openings. Subsequently, STI region(s) may be further formed by depositing STI dielectric material upon the STI liner. A etch back, recess, or the like, may occur to remove undesired or over formed STI liner and/or STI dielectric material, such that the top surface of the STI region(s) are coplanar with or below a bottom surface of the bottommost sacrificial nanolayer. STI liner may be composed of but not limited to a nitride, low-K nitride (i.e., a nitride material with a lower dielectric constant relative to $SiO_2$), or the like. The STI dielectric material may be composed of but not limited to an oxide, low-K oxide (i.e., an oxide material with a lower dielectric constant relative to $SiO_2$), or the like. For clarity, as the STI regions are formed within the substrate structure and may form substrate tracks. Upon the substrate tracks the transistors 100.2, 100.4, 100.6, and 100.8 may be formed.

The illustrated semiconductor IC device 100 may be further fabricated by next forming sacrificial gate structures (not shown). The sacrificial gate structures may include a sacrificial gate liner, a sacrificial gate, and a sacrificial gate cap. The sacrificial gate structures may be formed by initially depositing a sacrificial gate liner layer (e.g., a dielectric, oxide, or the like) upon the one or more STI regions and upon and around the one or more nanolayer stacks. The sacrificial gate structures may further be formed by subsequently depositing a sacrificial gate layer (e.g., amorphous silicon, or the like) upon the sacrificial gate liner layer. The thickness of the sacrificial gate layer may be such that the top surface of the sacrificial gate layer is above the top surface of the one or more nanolayer stacks. The sacrificial gate structures may further be formed by forming a gate cap layer upon the sacrificial gate layer. The gate cap layer may be formed by depositing a mask material, such as a hard mask material, such as silicon nitride, silicon oxide, combinations thereof, or the like, upon the sacrificial gate layer. The gate cap layer may be composed of one or more layers of masking materials to protect the sacrificial gate layer and/or other underlying materials during subsequent processing of semiconductor IC device 100.

The one or more sacrificial gate structures may further be formed by patterning the gate cap layer, sacrificial gate layer, and sacrificial gate liner by, for example, using lithography and etch processes to remove undesired portions and retain desired portion(s), respectively. The retained desired portion(s) of the gate cap layer, sacrificial gate layer, and sacrificial gate liner may form the sacrificial gate liner, the sacrificial gate, and the sacrificial gate cap, respectively, of each of the one or more sacrificial gate structures. The one or more sacrificial gate structures can be formed on targeted regions or areas of semiconductor IC device 100 to define the length of one or more transistors 100.2, 100.4, 100.7, and 100.8, or the like and to provide sacrificial material for yielding targeted transistor structure(s).

The illustrated semiconductor IC device 100 may be further fabricated by next removing the bottommost sacrificial nanolayer. The bottommost sacrificial nanolayer may be removed by a wet etch utilizing an etchant that targets the material of the bottommost sacrificial nanolayer selective to the respective material(s) of the sacrificial nanolayers, the active nanolayers 108, the STI region(s), and/or sacrificial gate structures, as appropriate. The etch may be timed or otherwise controlled to effectively remove the bottommost sacrificial nanolayer while substantially retaining the sacrificial nanolayers, the active nanolayers 108, the STI region(s), and the sacrificial gate structures, etc. The removal of bottommost sacrificial nanolayer may form a bottom isolation cavity between the substrate structure and the lowest sacrificial nanolayer.

The illustrated semiconductor IC device 100 may be further fabricated by next forming gate spacers 140 and a bottom isolation 142 in place of the removed bottommost sacrificial nanolayer within the nanolayer stacks. The gate spacer(s) 140 may be formed upon the sidewall(s) of the sacrificial gate structures, upon the STI region(s), and around the one or more nanolayer stacks.

The bottom isolation 142 and the gate spacer(s) 140 may be simultaneously formed by a conformal deposition of a dielectric material, such as silicon nitride, SiBCN, SiNC, SiN, SiCO, SiNOC, or a combination thereof, or the like, within the nanolayer cavity (ies), upon STI regions, upon around the one or more sacrificial gate structures, and upon and around the one or more nanolayer stack(s). Subsequently, undesired portions of dielectric material may be removed while desired portions the dielectric material may be retained and thereby form the bottom isolation 142 and the gate spacer(s) 140. The undesired portions of dielectric material may be removed by a directional ion etch, such as a reactive ion etch (RIE). The RIE may remove exposed or unprotected horizontal portions of the dielectric material while retaining protected horizontal portions of the dielectric layer (e.g., the bottom isolation 142) and vertical portions of the dielectric layer (e.g., the gate spacer(s) 140).

For clarity, semiconductor IC device 100, can also be fabricated by alternative operations that result in the absence of bottom isolation 142 or operations that retain the bottommost sacrificial nanolayer while the gate spacer(s) 140 are formed. This bottommost sacrificial nanolayer may be subsequently removed during the removal of the sacrificial nanolayers and the bottom isolation 142 may be formed along with the inner spacers 144.

The illustrated semiconductor IC device 100 may be further fabricated by next forming recesses within the one or more nanolayer stacks between gate spacers 140 of neighboring sacrificial gate structures. In other words, a single nanolayer stack may be separated, by one or more recesses, into multiple nanolayer stacks each located underneath at a portion of respective sacrificial gate structure and associated gate spacers 140.

The one or more recesses may be formed between adjacent sacrificial gate structures by removing respective portions of the sacrificial nanolayers and active nanolayers 108 that are between gate spacers 140 of adjacent or neighboring sacrificial gate structures. The one or more S/D recesses may be formed to a depth to stop at the top surface of the substrate structure (e.g., the top surface of upper substrate 102, or the like), the top surface of STI regions, or the like. Alternatively, the one or more S/D recesses may be formed to a depth within the upper substrate 102 above the etch stop layer 103.

The undesired portions of sacrificial nanolayers, active nanolayers 108, and the like, may be removed by etching or other subtractive removal techniques. The top surface of the substrate structure may be used as an etch stop or other etch parameters may be controlled to stop the material removal at the substrate structure. As the gate spacers 140 and the sacrificial gate structures may be utilized to protect the underlying portions of sacrificial nanolayers, active nanolayers 108, and bottom isolation 142 (if present), respective sidewalls of the nanolayer stacks may be substantially coplanar and substantially vertical with the outer sidewalls of the gate spacers 140 there above.

As used herein, "substantially vertical" sidewalls deviate from a direction normal to a major surface (e.g., top surface, etc.) of the substrate 102 by less than 5°, e.g., 0°, 1°, 2°, 3°, 4°, or 5°, including ranges between any of the foregoing values.

The illustrated semiconductor IC device 100 may be further fabricated by next forming horizontal or lateral indents by laterally or horizontally removing respective portions of sacrificial nanolayers within the nanolayer stacks. The indents may be formed by a reactive ion etch (RIE) process, which can remove portions of the sacrificial nanolayers. The horizontal depth of the indents may be chosen to set a length for a replacement gate structure 170 that is formed in place of one sacrificial gate structure. When the sacrificial nanolayers are composed of SiGe and when active nanolayers 108 are Si, the directional RIE can use a boron-based chemistry or a chlorine-based chemistry, for example, which recesses or removes the exposed end portions of sacrificial nanolayers (e.g., end portions of sacrificial nanolayers generally below spacer 140) selective to the Si active nanolayers 108. In alternative implementations when sacrificial nanolayers are not SiGe and when active nanolayers 108 are not Si, the directional etch of the sacrificial nanolayers may generally be selective to the active nanolayers 108, gate spacers 140, STI regions, and/or substrate structure.

The illustrated semiconductor IC device 100 may be further fabricated by next forming a respective inner spacer 144 within each indent. The one or more inner spacers 144 can be formed by ALD or CVD or any other suitable deposition technique that deposits a dielectric material within the indent(s), thereby forming the inner spacer(s). In some examples, the inner spacer(s) 144 are composed of a low-K dielectric material (a material with a lower dielectric constant relative to $SiO_2$), SiN, SiO, SiBCN, SiOCN, SiCO, etc. or any other suitable dielectric material. In certain implementations, after the formation of the inner spacer(s) 144, an directional etch process is performed to create substantially vertical sidewalls of the inner spacer(s) 144 that are coplanar with the substantially vertical sidewalls of the active nanolayers 108, of the gate spacers 140, and/or of the bottom isolation 142.

The illustrated semiconductor IC device 100 may be further fabricated by next forming one or more backside contact placeholders 162 within the substrate structure in between adjacent sacrificial gate structures within a respective recess. In one example, a respective backside contact placeholder 162 may be formed in all recess location(s) within the transistor region 111 such that a respective backside contact placeholder 162 is located underneath each S/D region 164 within the transistor region 111.

If the recesses are not of sufficient depth, the one or more backside contact placeholders 162 may be formed by forming one or more backside contact placeholder cavities within the substrate structure generally in between adjacent sacrificial gate structures and below the prior respective one or more recesses. For example, the one or more backside contact placeholder(s) cavities may be formed by a subtractive removal technique, such as an etch, that removes associated portion(s) of the upper substrate 102. The etch may be timed or otherwise controlled to stop the removal of the upper substrate 102 such that the depth or bottom of the one or more backside contact placeholder(s) cavities are above the etch stop layer 103.

The one or more backside contact placeholders 162 may be further formed by epitaxially growing an epitaxial material from exposed substrate structure surface(s) within the one or more backside contact placeholder(s) cavities. In some embodiments, epitaxial growth and/or deposition processes may be selective to forming on the semiconductor surfaces of the upper substrate 102, and may not deposit material on dielectric surfaces, such as silicon dioxide or silicon nitride surfaces. In some embodiments, the epitaxial growth of the one or more backside contact placeholders 162 may overgrow above the top surface of the substrate structure or above the top surface of bottom isolation 142. In an example, the epitaxial material of the one or more backside contact placeholders 162 may be chosen to be etch selective to the material of the S/D region(s) 164, the material of the upper substrate 102, or the like.

Figure 8:
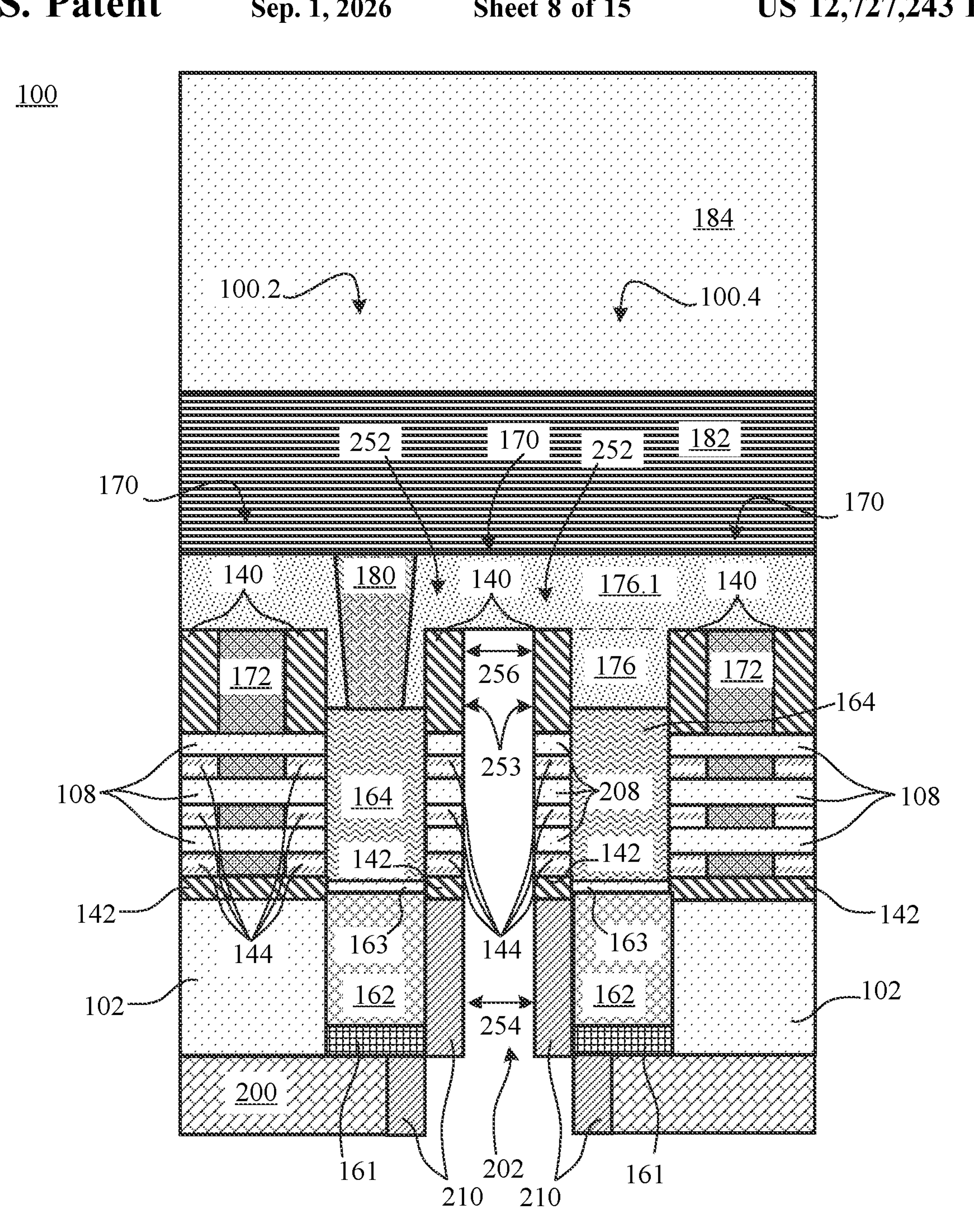

In an example, as depicted, a placeholder protective cap 161 may be formed within the one or more backside contact placeholder(s) cavities. The placeholder protective cap 161 may be utilized to help protect or mask the associated backside contact placeholder 162 during the etching process (es) utilized to create a backside diffusion break opening 202, as depicted in FIG. 8. The placeholder protective cap(s) 161 may be epitaxially grown. For example, the one or more backside contact placeholders 162 may be SiGe and the placeholder protective cap(s) 161 may be undoped SiGe. In these examples, the backside contact placeholder 162 may be epitaxially grown from the associated underling placeholder protective cap 161.

In another example, as depicted, an etch stop layer 163 (e.g., a Si epitaxially grown layer, or the like) may be formed upon the top surface of the backside contact placeholders 162. For example, the one or more backside contact placeholders 162 may be SiGe and a Si etch stop layer 163 may be epitaxially grown from the top surface of the SiGe backside contact placeholders 162. Respective top surfaces of the backside contact placeholders 162 (or etch stop layer 163 thereupon) may be substantially horizontal and below the bottom surface of the bottommost active nanolayer 108 (e.g., to enable contact between such active nanolayer 108 and the S/D region 164) and/or substantially coplanar with a respective one or more top surface(s) of bottom isolation 142.

The illustrated semiconductor IC device 100 may be further fabricated by next forming one or more respective S/D regions 164 upon a respective backside contact placeholder 162. For example, p-doped S/D regions 164 may be formed in a first formation sequence and then n-doped S/D regions 164 may be formed in a second formation sequence, or vice versa.

Each S/D region 164 may form either a source or a drain, respectively, of a respective transistor and is connected to respective end surfaces of the active nanolayers 108 of one or more nanolayer stacks. Each S/D region 164 is composed of a semiconductor material and a dopant. As used herein, a "source/drain" region can be a source region or a drain region depending on subsequent wiring and application of voltages during operation of the applicable transistor.

The semiconductor material that provides each of the S/D regions 164 may be composed of one of the semiconductor materials mentioned above for the semiconductor structure. For example, the semiconductor material that provides the S/D region 164 can be compositionally the same, or compositionally different from each active nanolayer 108. The dopant that is present in the S/D regions 164 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "n-type" refers to the addition of impurities that contributes free electrons to an intrinsic semiconductor. In a silicon containing semiconductor material, examples of n-type dopants, include, but are not limited to, antimony, arsenic and phosphorous. In one example, the S/D regions 164 can have a dopant concentration of from $4\times10^{20}$ atoms/$cm^3$ to $3\times10^{21}$ atoms/$cm^3$. When the semiconductor material is doped with a p-type dopant, the resulting S/D regions 164 are referred to herein as being p-doped and when the semiconductor material is doped with a n-type dopant, the resulting S/D regions 164 are referred to herein as being n-doped.

The S/D regions 164 may be epitaxially grown or formed. In some examples, the S/D regions 164 are formed by in-situ doped epitaxial growth. The use of an in-situ doping process is merely an example. For instance, one may instead employ an ex-situ process to introduce dopants into the S/D regions 164. Other doping techniques can be used to incorporate dopants in the S/D regions 164. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. In examples, S/D epitaxial growth conditions promote in-situ Boron doped SiGe for p-type transistor and phosphorus or arsenic doped silicon or Si:C for n-type transistors.

In some examples, the epitaxial growth that forms the S/D region 164 occurs or is promoted from the top surface of upper substrate 102, from the upper surface of backside contact placeholders 162 (or etch stop layer 163 thereupon), or the like, while epitaxial growth may be limited or does not occur from neighboring STI regions.

In some embodiments, epitaxial growth to form the one or more S/D regions 164 may overgrow above the upper surface of the sacrificial gate structure(s) and be subsequently recessed such that the top surface of the S/D region 164 may be substantially horizontal and above the top surface of the topmost active nanolayer 108 within the nanolayer stacks (e.g., to enable contact between the end surface of that active nanolayer 108 and the S/D region 164).

The illustrated semiconductor IC device 100 may be further fabricated by next forming interlayer dielectric (ILD) 176. For example, a blanket ILD 176 may be deposited over the S/D region(s) 164, over the STI region(s), over the sacrificial gate structures, and over the gate spacers 140, and the like.

The ILD 176 can be any suitable material, such as, for example, porous silicates, carbon doped oxides, silicon dioxides, silicon nitrides, silicon oxynitrides, OPL, or other dielectric materials. Any known manner of forming the ILD 176 can be utilized. The ILD 176 can be formed using, for example, CVD, PECVD, ALD, flowable CVD, spin-on dielectrics, or PVD.

In an example, the ILD 176 may be formed to a thickness above the top surface of the sacrificial gate structures. Subsequently, a planarization process, such as a CMP, may be performed to remove excess ILD 176 material and to remove the sacrificial gate caps of the sacrificial gate structures, thereby exposing the sacrificial gate thereunder. The planarization may also partially remove some of the sacrificial gates or may at least expose the sacrificial gate of the sacrificial gate structures. The CMP may create a substantially planar or substantially horizontal top surface for the semiconductor IC device 100. In other words, the respective top surfaces of ILD 176, gate spacers 140, sacrificial gates, S/D regions 164, etc. may be substantially coplanar and/or substantially horizontal.

The illustrated semiconductor IC device 100 may be further fabricated by next removing the sacrificial gate structures and then forming replacement gate structures 170 in place thereof. The sacrificial gate structures may be removed by initially removing the sacrificial gate and sacrificial gate oxide by a removal technique, such as one or more series of etches. For example, such removal may be accomplished by a wet chemical etching process in which one or more chemical etchants are used to remove the sacrificial gate and sacrificial gate oxide of the sacrificial gate structures. Appropriate etchants may be used that remove the sacrificial gate and/or sacrificial gate oxide selective to the active nanolayers 108, inner spacers 144, gate spacers 140, the bottom isolation 142, STI regions, or the like. For clarity, the removal of the sacrificial gate structure may further remove the sacrificial gate, sacrificial gate oxide, or the like.

Next, or simultaneously, the active nanolayers 108 may be released by removing the sacrificial nanolayers within the nanolayer stacks. The sacrificial nanolayers may be removed by a removal technique, such as one or more series of etches. For example, the etching can include a wet chemical etching process in which one or more chemical etchants are used to remove the sacrificial nanolayers. Appropriate etchants may be used that remove the sacrificial nanolayers selective to the active nanolayers 108, inner spacers 144, the bottom isolation 142, gate spacers 140, or the like. After the removal of sacrificial nanolayers, void spaces may be formed above and/or below the active nanolayers 108.

The illustrated semiconductor IC device 100 may be further fabricated by next forming a replacement gate structure 170 in place of the removed sacrificial gate structures around the active nanolayers 108, upon STI region(s), upon the bottom isolation 142, etc.

Replacement gate structure(s) 170 may be formed by initially forming an interfacial layer on the gate spacers 140, on the active nanolayers 108, on the bottom isolation 142, on the inner spacers 144, etc. that are interior to and/or upon the respective surfaces interior to the opening created by the removal of the sacrificial gate structure and the releasing of the active nanolayers 108. The interfacial layer can be deposited by any suitable techniques, such as ALD, CVD, PVD, thermal oxidation, combinations thereof, or other suitable techniques.

The replacement gate structure(s) 170 may be further formed by forming a high-k layer to cover the exposed surfaces of the interfacial layer. The high-K layer can be deposited by any suitable techniques, such as ALD, CVD, metal-organic CVD (MOCVD), PVD, thermal oxidation, combinations thereof, or other suitable techniques. A high-κ material is a material with a higher dielectric constant than that of $SiO_2$, and can include e.g., LaO, AlO, ZrO, TiO, $Ta_2O_5$, $Y_2O_3$, $SrTiO_3$(STO), $BaTiO_3$(BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The high-K layer can include a single layer or multiple layers, such as metal layer, liner layer, wetting layer, and adhesion layer. In other embodiments, the high-K layer can include, e.g., Ti, Ag, Al, TiAlN, TaC, TaCN, TaSiN, Mn, Zr, TiN, TaN, Ru, Mo, Al, WN, Cu, W, or any suitable materials.

The replacement gate structure(s) 170 may be further formed by depositing a work function (WF) gate upon the high-K layer. The WF gate can be comprised of a conductor or metal, such as, e.g., copper (Cu), cobalt (Co), aluminum (Al), platinum (Pt), gold (Au), tungsten (W), titanium (Ti), nitride ($N^{3-}$) or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. In general, the WF gate sets the threshold voltage (Vt) of the device. The high-κ layer may separate the WF gate from the nanolayer channel (i.e., active nanolayer 108). Other metals that may be desired to further fine tune the effective work function (eWF) and/or to achieve a desired resistance value associated with current flow through the gate in the direction parallel to the plane of the nanolayer channel.

The replacement gate structure(s) 170 may be further formed by depositing a conductive gate 172. In an example, when none of the previous replacement gate material(s) are utilized in the replacement gate structures, the conductive gate may be formed upon the same or similar surfaces as those upon which the interfacial layer, described above, may be formed. In other examples, when one or more of the interfacial layer, the high-k layer, the WF gate, or the like, are utilized in the replacement gate structures, the conductive gate may be formed upon the most recent structural formation thereof.

The conductive gate 172 can be comprised of a conductor material and/or metal, such as but not limited to, e.g., tungsten, aluminum, ruthenium, rhodium, cobalt, copper, tantalum, titanium, carbon nanowire materials including graphene, or the like. The conductor material and/or metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. After the replacement gate structure 170 formation, the top surface of the semiconductor IC device 100 may be planarized by a planarization technique such as a CMP, mechanical grinding process, or the like. After the planarization technique, respective top surfaces of the ILD 176, gate spacers 140, replacement gate structures 170, or the like, may be substantially horizontal and/or may be substantially coplanar.

The illustrated semiconductor IC device 100 may be further fabricated by next forming a frontside contact ILD 176.1. The frontside contact ILD 176.1 may be formed upon respective top surfaces of replacement gate structure(s) 170, ILD 176, and gate spacers 140. The frontside contact ILD 176.1 may be formed by depositing a dielectric material, such as, for example, porous silicates, carbon doped oxides, silicon dioxides, silicon nitrides, silicon oxynitrides, or other dielectric materials. Any appropriate deposition technique for forming the frontside contact ILD 176.1 can be utilized. The frontside contact ILD 176.1 can be formed using, for example, CVD, PECVD, ALD, flowable CVD, spin-on dielectrics, or PVD.

The illustrated semiconductor IC device 100 may be further fabricated by next forming frontside contacts 180 within the frontside contact ILD 176.1 and the ILD 176. The frontside contacts 180 may be formed by patterning respective frontside contact openings within frontside contact ILD 176.1 and ILD 176, respectively, from the frontside (i.e., from above the semiconductor IC device 100, as depicted, downward to respective structures thereof). The frontside contact 180 may be in direct or indirect physical and electrical contact and/or may physically meld with respective material(s) of one or more regions of the semiconductor IC device 100. For example, an illustrated frontside contact 180 is in direct contact with S/D region 164 of transistor 100.2. A different frontside contact 180 may be in direct contact with a particular replacement gate structure 170.

The frontside contacts 180 may be formed by initially forming frontside contact opening(s). The frontside contact opening(s) may be formed by the same or shared lithography and etch process(es) or by sequential lithography and etch processes. In such process(es), a mask may be applied and patterned. An opening in the patterned mask may expose the portion of the underlying contact ILD 176.1 and/or ILD 176 to be removed while other protected portions of semiconductor IC device 100 thereunder may be protected and retained. In such process(es), the dry and wet etching processes can have etching parameters that can be tuned, such as etchants used, etching temperature, etching solution concentration, etching pressure, source power, RF bias voltage, RF bias power, etchant flow rate, to promote desired material removal and desired material retention. Generally, the frontside contact openings expose at least a portion of the underlying semiconductor IC device 100 structure that which the associated frontside contact 180 is to make direct contact therewith.

The frontside contact(s) 180 may be further formed by depositing conductive material such as metal into the respective frontside contact opening(s). In an example, frontside contact(s) 180 may be formed by depositing a liner, such as Ni, NiPt or Ti, etc. into the contact opening(s), depositing an adhesion liner, such as TiN, TaN, etc. upon the liner, and by depositing a conductive fill, such as Al, Ru, W, Co, Cu, etc. upon the metal adhesion liner. Subsequently, a planarization process, such as a CMP process or a mechanical grinding process, may remove excess portions of the liner, the metal adhesion liner, and the conductive fill. Subsequently, the respective top surfaces of frontside contact(s) 180 and the frontside contact ILD 176.1 may be substantially horizontal and/or substantially coplanar. In embodiments, the frontside contact(s) 180 are fabricated in middle-of-line (MOL) fabrication operations and may be illustrations of MOL frontside contacts.

In the semiconductor IC device fabrication industry, there are three sections referred to in a build: front-end-of-line (FEOL), back-end-of-line (BEOL), and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices.

Figure 13:
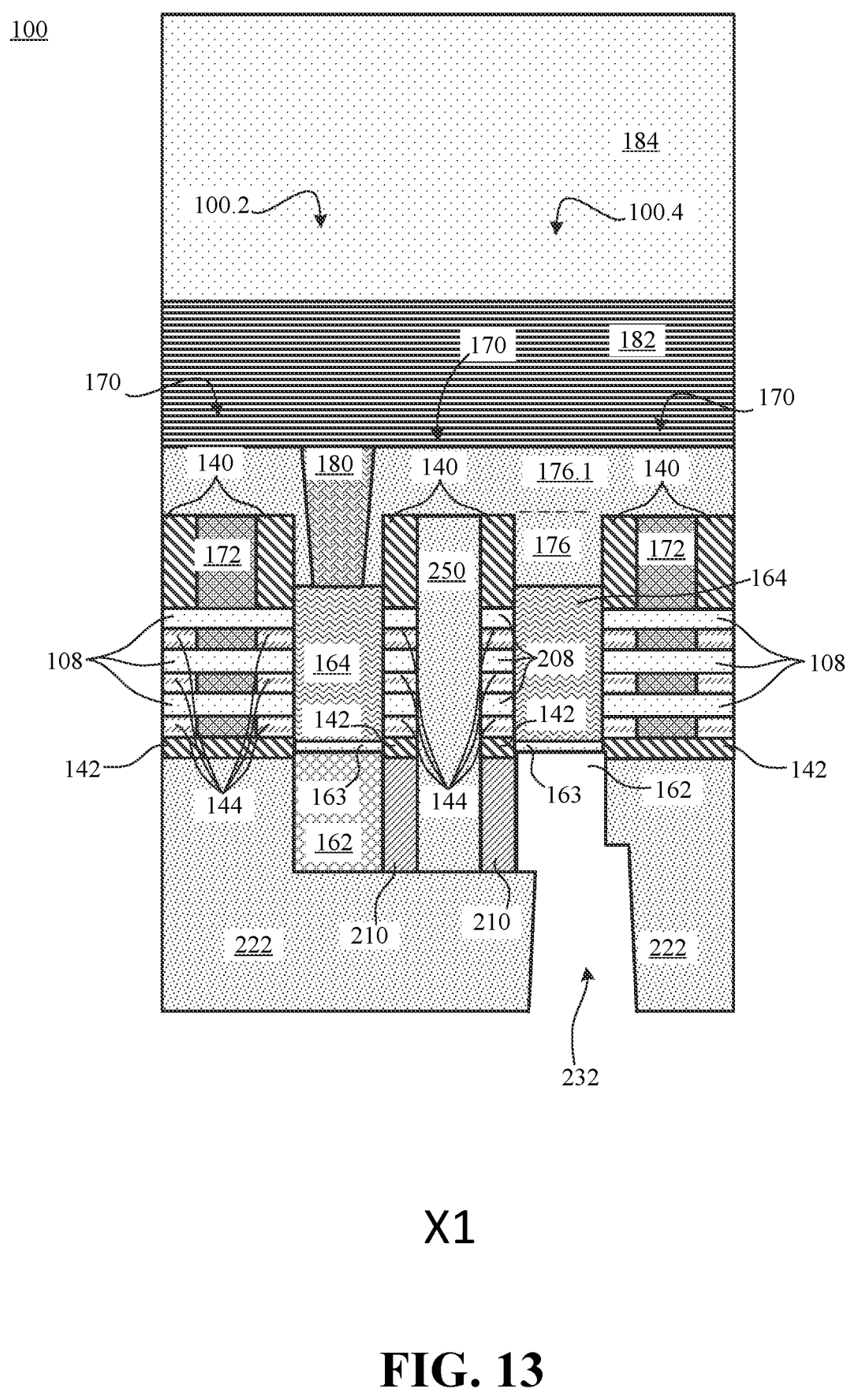

BEOL is the second portion of IC fabrication where the individual devices (e.g., transistors, capacitors, resistors, etc.) become interconnected with wiring on the semiconductor IC device, e.g., the metallization layer or layers of a wafer. BEOL includes contacts, insulating layers (dielectrics), metal levels, and bonding sites for chip-to-package connections. In the BEOL, part of the fabrication stage contacts (pads), interconnect wires, vias and dielectric structures are formed. For modern IC processes, more than one metal layers may be added in the BEOL. In the present example, there are multiple BEOL levels each on opposites sides of the semiconductor IC device 100. First, a frontside BEOL network 182 is formed on the frontside of the semiconductor device 100. Subsequently, a backside BEOL network 260, as depicted in FIG. 13, is formed.

In the depicted example, the frontside BEOL network 182 is formed over the contact ILD 176.1 and upon the frontside contacts 180. Respective wires within the frontside BEOL network 182 may be electrically connected to the one or more S/D regions 164, to the one or more replacement gate structure(s) 170, or the like, by a respective frontside contact(s) 180. For example, respective wire(s) within the frontside BEOL network 182 may be electrically connected to appropriate S/D regions 164 by a frontside contact 180, another and different group of respective wire(s) within the frontside BEOL network 182 may be electrically connected to appropriate replacement gate structures 170, etc.

In different implementations, the frontside contacts 180 may take the form of BEOL interconnects. In these implementations, the respective wires within the frontside BEOL network 182 may be electrically connected to the S/D regions 164, replacement gate structure(s) 170, or the like, by a lowest BEOL interconnect, such as a vertical interconnect access (VIA), that is within the frontside BEOL network 182.

The frontside BEOL network 182 is located directly on the frontside surface of the MOL structure (e.g., contact ILD 176.1, frontside contact(s) 180, etc.). The frontside BEOL network 182 can include one or more interconnect dielectric material layers (including one of the dielectric materials mentioned above for the frontside ILD 176) and contains metal wires (the metal wires can be composed of any electrically conductive metal or electrically conductive metal alloy) embedded therein. In some embodiments, the frontside metal wires within the frontside BEOL network 182 are composed of Cu. The frontside BEOL network 182 can include "x" numbers of frontside metal levels, wherein "x" is an integer starting from 1. The frontside BEOL network 182 may further contain conductive pads that are connected to one or more of the metal wires and may be used to connect the semiconductor IC device 100 to an external and/or higher-level structure, such as a chip carrier, motherboard, or the like.

The illustrated semiconductor IC device 100 may be further fabricated by next bonding carrier wafer 184 to the frontside BEOL network 182. The carrier wafer 184 can include one of the semiconductor materials mentioned above for the semiconductor structure and the carrier wafer 184 may be attached to the semiconductor IC device 100 by a wafer-to-wafer bonding technique.

Figure 5:
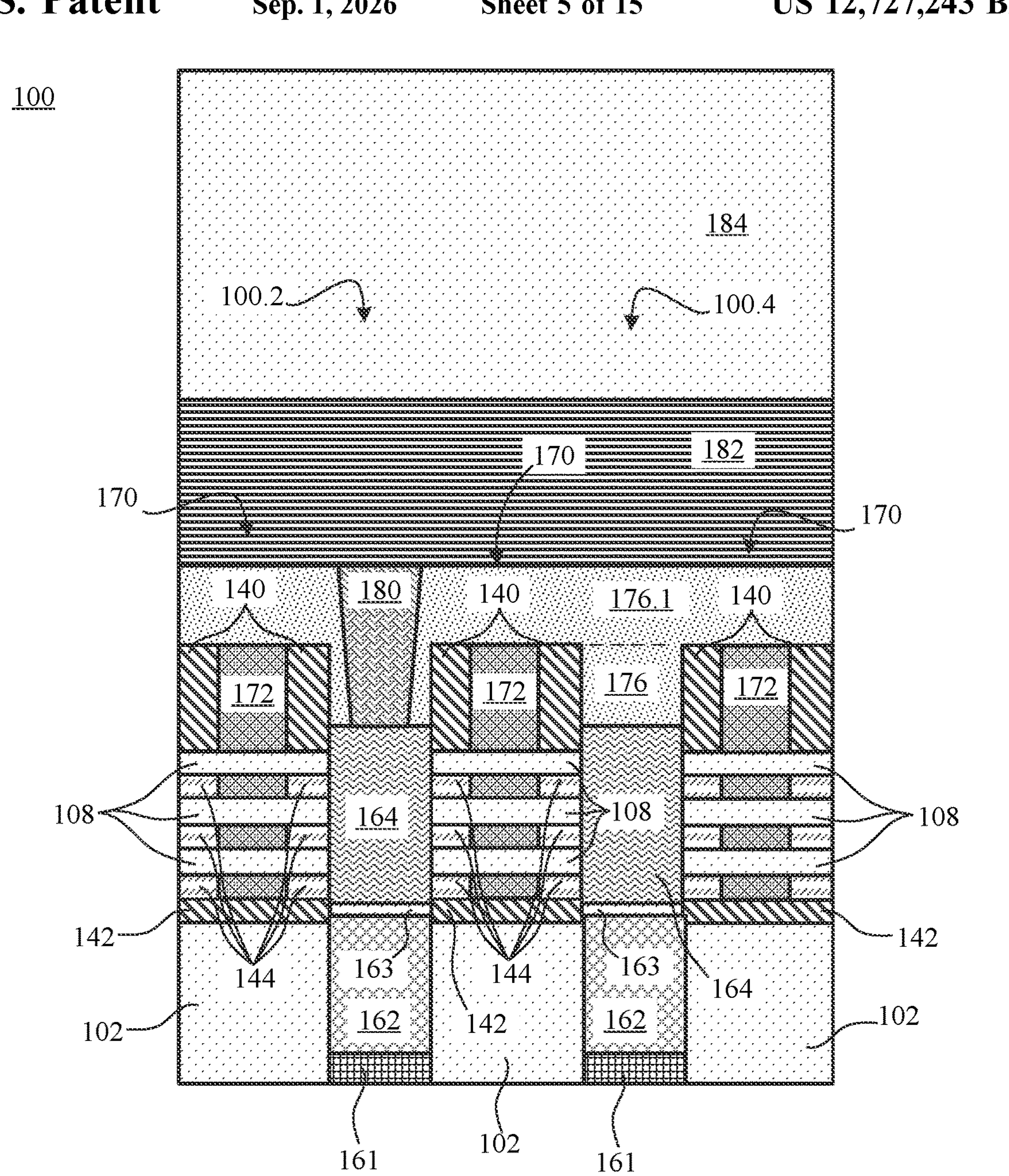

FIG. 5 depicts cross-sectional views of the semiconductor IC device 100 after fabrication operations, in accordance with embodiments of the present disclosure. In the depicted fabrication stages, the substrate structure may be recessed. For example, the lower substrate 101 and the etch stop layer 103 may be removed.

The substrate structure may be recessed by flipping the semiconductor IC device 100 and removing the lower substrate 101 using any removal technique, such as a combination of wafer grinding, CMP, dry, and/or wet etch. In the example depicted, lower substrate 101 is removed by an etch that utilizes etch stop layer 103 as the etch stop. In this example, removal of lower substrate 101 exposes the bottom surface of etch stop layer 103.

The etch stop layer 103 may be removed by a subtractive removal technique such as a CMP, dry and/or wet etch. Upon removal of the etch stop layer 103, the bottom surface upper substrate 102 is exposed. The removal of etch stop layer 103 may be selective to the material of upper substrate 102. For example, etch stop layer 103 is removed by an etch that utilizes upper substrate 102 as the etch stop.

Figure 6:
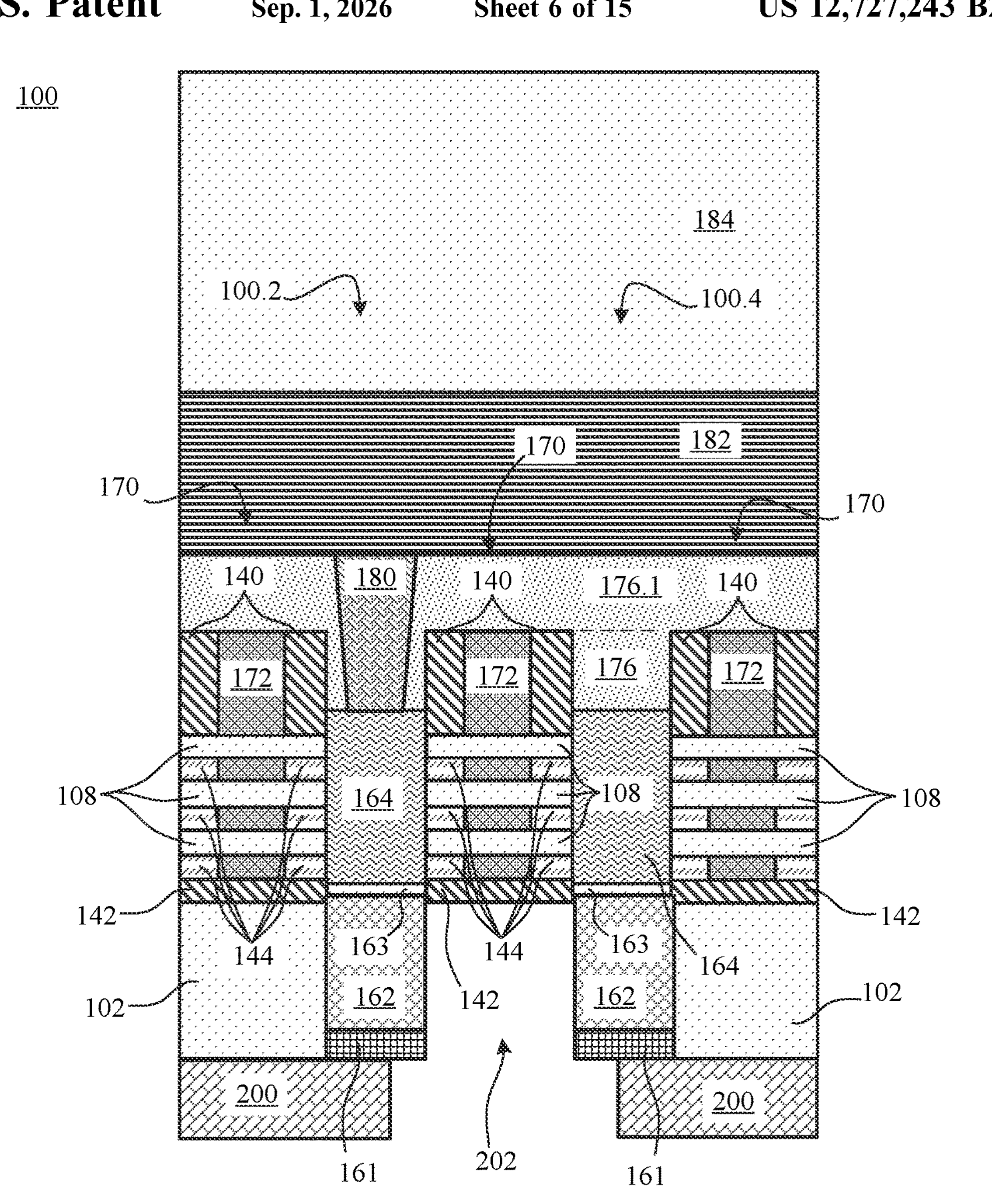

FIG. 6 depicts cross-sectional views of the semiconductor IC device 100 after fabrication operations, in accordance with embodiments of the present disclosure. In the depicted fabrication stages, the upper substrate 102 may be removed in location(s) between adjacent backside contact placeholders 162 in which a diffusion break region is to be formed.

The substrate structure may be removed in the diffusion break region by a lithography and etch process(es), or sequential etch processes. In such process(es), a mask 200 may be applied to the backside of semiconductor IC device 100 and patterned. The mask 200 may be removed which exposes the upper substrate 102 in the diffusion break region. Subsequently, the exposed upper substrate 102 may be removed and may expose the bottom isolation 142 (if present) between associated adjacent backside contact placeholders 162.

The upper substrate 102 therein may be removed by an appropriate substrative removal technique, such as an etch. The etch may be timed or otherwise controlled to remove the material of substrate 102 selective to the STI regions, to the backside contact placeholders 162, to the bottom isolation 142, or the like. The removal of the upper substrate 102 between adjacent backside contact placeholders 162 may effectively form the backside diffusion break opening 202.

Figure 7:
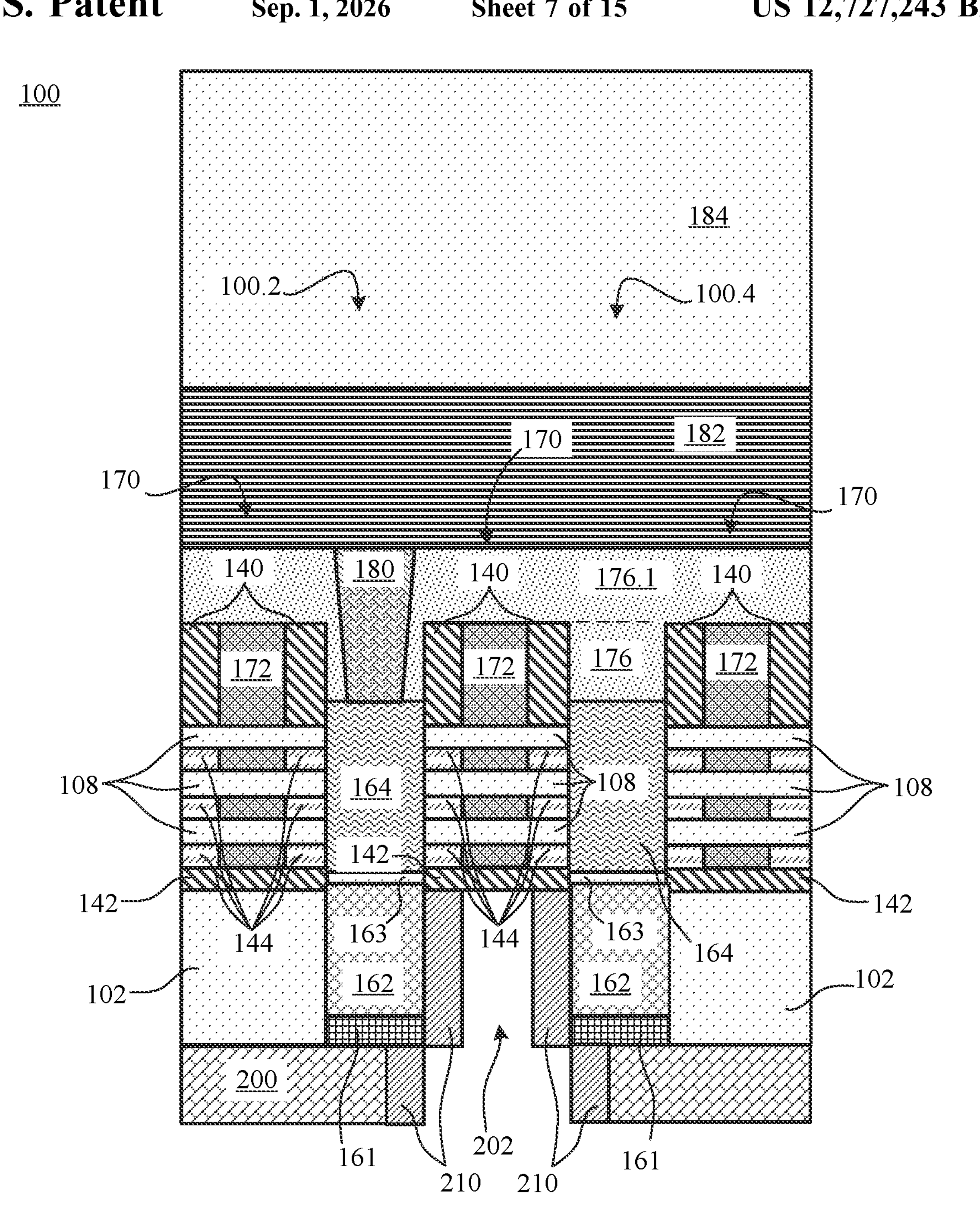

FIG. 7 depicts cross-sectional views of the semiconductor IC device 100 after fabrication operations, in accordance with embodiments of the present disclosure. In the depicted fabrication stages, diffusion break spacer(s) 210 are formed within the backside diffusion break opening 202. The diffusion break spacer(s) 210 may be formed upon at least the sidewall(s) of the adjacent backside contact placeholders 162 within the backside diffusion break opening 202.

The diffusion break spacer(s) 210 may be formed by a conformal deposition of a dielectric material, such as silicon nitride, SiBCN, SiNC, SiN, SiCO, SiNOC, or a combination thereof, or the like, within the backside diffusion break opening 202 and upon mask 200. Subsequently, undesired portions of dielectric material may be removed while desired portions the dielectric material may be retained and thereby form the diffusion break spacer(s) 210. The undesired portions of dielectric material may be removed by a directional ion etch, such as a reactive ion etch (RIE). The RIE may remove exposed or unprotected horizontal portions of the dielectric material and retain protected vertical portions of the dielectric layer to form the diffusion break spacer(s) 210.

FIG. 8 depicts cross-sectional views of the semiconductor IC device 100 after fabrication operations, in accordance with embodiments of the present disclosure. In the depicted fabrication stages, the backside diffusion break opening 202 is enlarged by removing the bottom isolation 142, the replacement gate structure 170, and the active semiconductor nanolayers 108 within the diffusion break region. The enlarged backside diffusion break opening 202 may resultantly form a respective diffusion break isolation wall 252 on either side of the backside diffusion break opening 202. Therefore, in the embodiments of the disclosure, the diffusion break isolation walls 252 may effectively protect the S/D regions 164 and underlying backside contact placeholder(s) 162 during the formation of enlarged backside diffusion break opening 202.

The backside diffusion break opening 202 is enlarged by removing the bottom isolation 142, the replacement gate structure 170, and the active semiconductor nanolayers 108 utilizing the mask 200 and the diffusion break spacer(s) 210 to effectively protect the underlying semiconductor IC device 100. A substrative removal technique, such as an etch may remove the bottom isolation 142, the replacement gate structure 170, and the active semiconductor nanolayers 108 that are exposed by the backside diffusion break opening 202.

In certain implementations, after the removal of the bottom isolation 142, the replacement gate structure 170, and the active semiconductor nanolayers 108, a directional etch process may performed to create substantially vertical sidewalls 253 of the diffusion break isolation walls 252. In alternative implementations, the etch may result in angled sidewalls 253 such that a horizontal perimeter dimension 254 near the bottom of the backside diffusion break opening 202 that is larger than a horizontal perimeter dimension 256 near the top of the backside diffusion break opening 202. These angled sidewalls 253 may be the result of the backside etch direction of the backside diffusion break opening 202.

In embodiments of the disclosure, each diffusion break isolation wall 252 may include respective portions of diffusion break spacer 210, bottom isolation 142, inner spacers 144, residual nanolayer channel layers 208, and/or gate spacer 140. The residual nanolayer channel layers 208 may be residual portions of the active semiconductor nanolayers 108, respectively.

Figure 9:
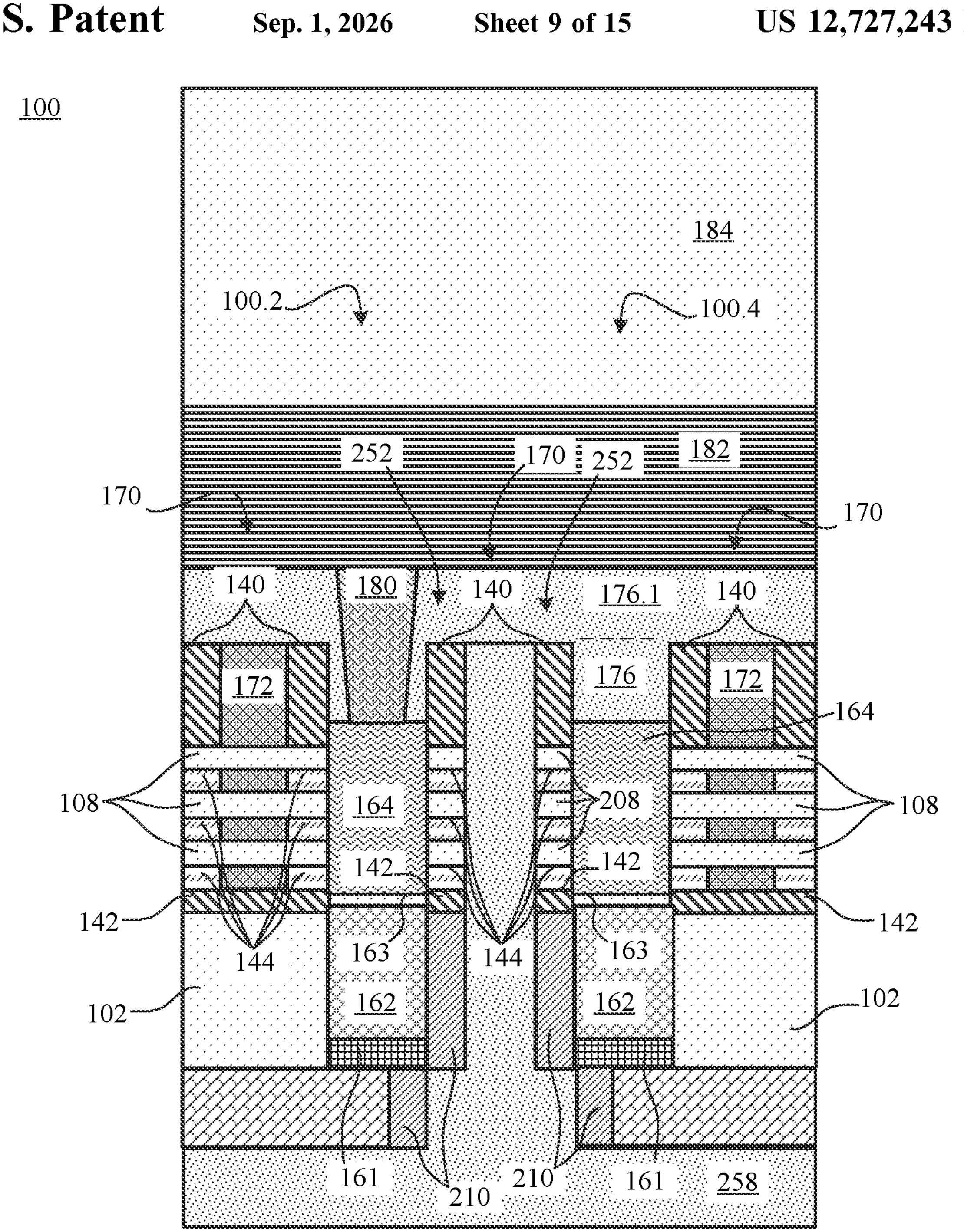

FIG. 9 depicts cross-sectional views of semiconductor IC device 100 shown after illustrative fabrication operation(s), in accordance with one or more embodiments. In the depicted fabrication stage, backside ILD 258 may be formed upon the exposed backside of the semiconductor IC device 100.

The backside ILD 258 may be formed within the backside diffusion break opening 202 and upon respective sidewall(s) 253 of the diffusion break isolation wall(s) 252. The backside ILD 258 may be formed by depositing a dielectric material, such as, for example, porous silicates, carbon doped oxides, silicon dioxides, silicon nitrides, silicon oxynitrides, or other dielectric materials. Any appropriate deposition technique for forming the backside ILD 258 can be utilized. The backside ILD 258 can be formed using, for example, CVD, PECVD, ALD, flowable CVD, spin-on dielectrics, or PVD.

In an example, as depicted, the material of the backside ILD 258 may be the same material as the frontside ILD 176 and/or the frontside contact ILD 176.1. In alternative examples, the material of the backside ILD 258 may be chosen to achieve a predetermined electrical isolation metric between the transistor 100.2 and the transistor 100.4 that the dielectric material of frontside ILD 176, 176.1, could not achieve if utilized. For example, frontside ILD 176, 176.1 may be silicon dioxide and the backside ILD 258 may be a low-K dielectric material.

FIG. 10 depicts cross-sectional views of semiconductor IC device 100 shown after illustrative fabrication operation (s), in accordance with one or more embodiments. In the depicted fabrication stage, the backside of the semiconductor IC device 100 may be planarized and the backside contact placeholders 162 may be exposed.

For example, a planarization process, such as a CMP, may expose a bottom surface of the backside contact placeholders 162. As a result, the respective bottom surfaces of backside contact placeholders 162, upper substrate 102, the backside ILD 258, and the diffusion break spacers 210 may be substantially horizontal and/or substantially coplanar. The backside ILD 258 that remains within the backside diffusion break opening 202 may form diffusion break dielectric 250. Therefore, the respective bottom surfaces of backside contact placeholders 162, upper substrate 102, the diffusion break dielectric 250, and the diffusion break spacers 210 may be substantially horizontal and/or substantially coplanar.

Figure 11:
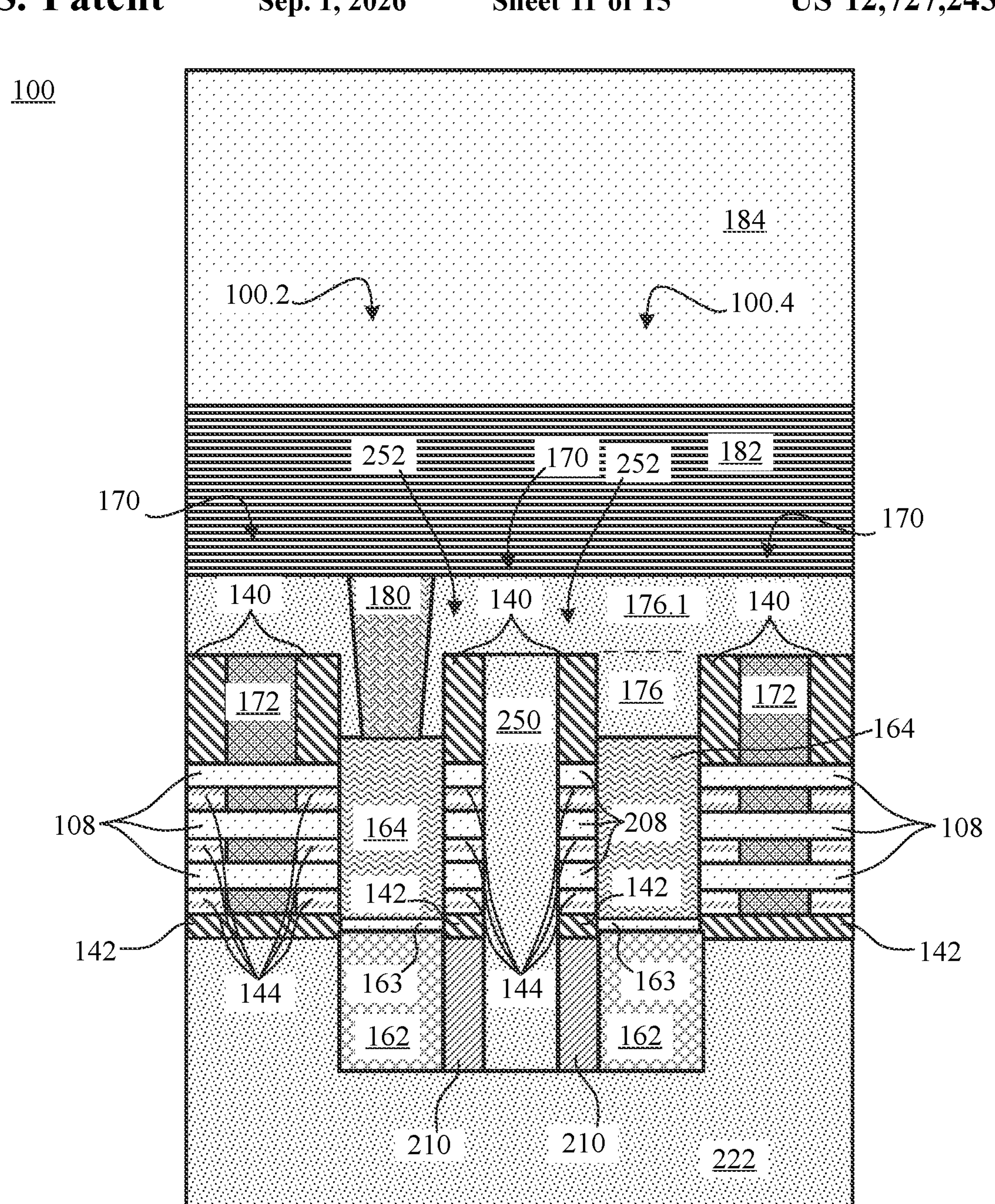

FIG. 11 depicts cross-sectional views of semiconductor IC device 100 shown after illustrative fabrication operation (s), in accordance with one or more embodiments. In the depicted fabrication stage, the upper substrate 102 may be removed and a backside ILD 222 may be formed.

The upper substrate 102 may be removed by a lithography and etch process(es), or sequential etch processes. The upper substrate 102 may be removed by an appropriate substrative removal technique, such as an etch. The etch may be timed or otherwise controlled to remove the material of substrate 102 selective to the STI regions, to the backside contact placeholders 162, to the bottom isolation 142, to the diffusion break spacers 210, and to the diffusion break dielectric 250, or the like.

Upon the partial removal of the upper substrate 102, respective portions of the STI regions may be exposed. In an example, upper substrate 102 is removed by an etch that utilizes STI regions as the etch stop. In another example, the etch that recesses upper substrate 102 may be controlled such that the depth of such etch results in the bottom surface of upper substrate 102 to be between the bottom surface and top surface of the STI region(s). In this example, the etch that recesses upper substrate 102 may be controlled such that the depth of such etch results in the bottom surface of upper substrate 102 to be between the bottom surface of the backside contact placeholders 162 and top surface of the STI region(s).

Subsequently, the backside ILD 222 may be formed upon the respective exposed backside surfaces of the STI regions, the backside contact placeholder(s) 162, the bottom isolation 142, diffusion break spacers 210, the diffusion break dielectric 250, and the like. The backside ILD 222 may be formed by depositing a dielectric material, such as, for example, porous silicates, carbon doped oxides, silicon dioxides, silicon nitrides, silicon oxynitrides, or other dielectric materials. Any appropriate deposition technique for forming the backside ILD 222 can be utilized. The backside ILD 222 can be formed using, for example, CVD, PECVD, ALD, flowable CVD, spin-on dielectrics, or PVD. In an example, as depicted, the material of the backside ILD 222 may be the same material as the diffusion break dielectric 250 and/or the frontside ILD 176 and/or the frontside contact ILD 176.1.

Figure 12:
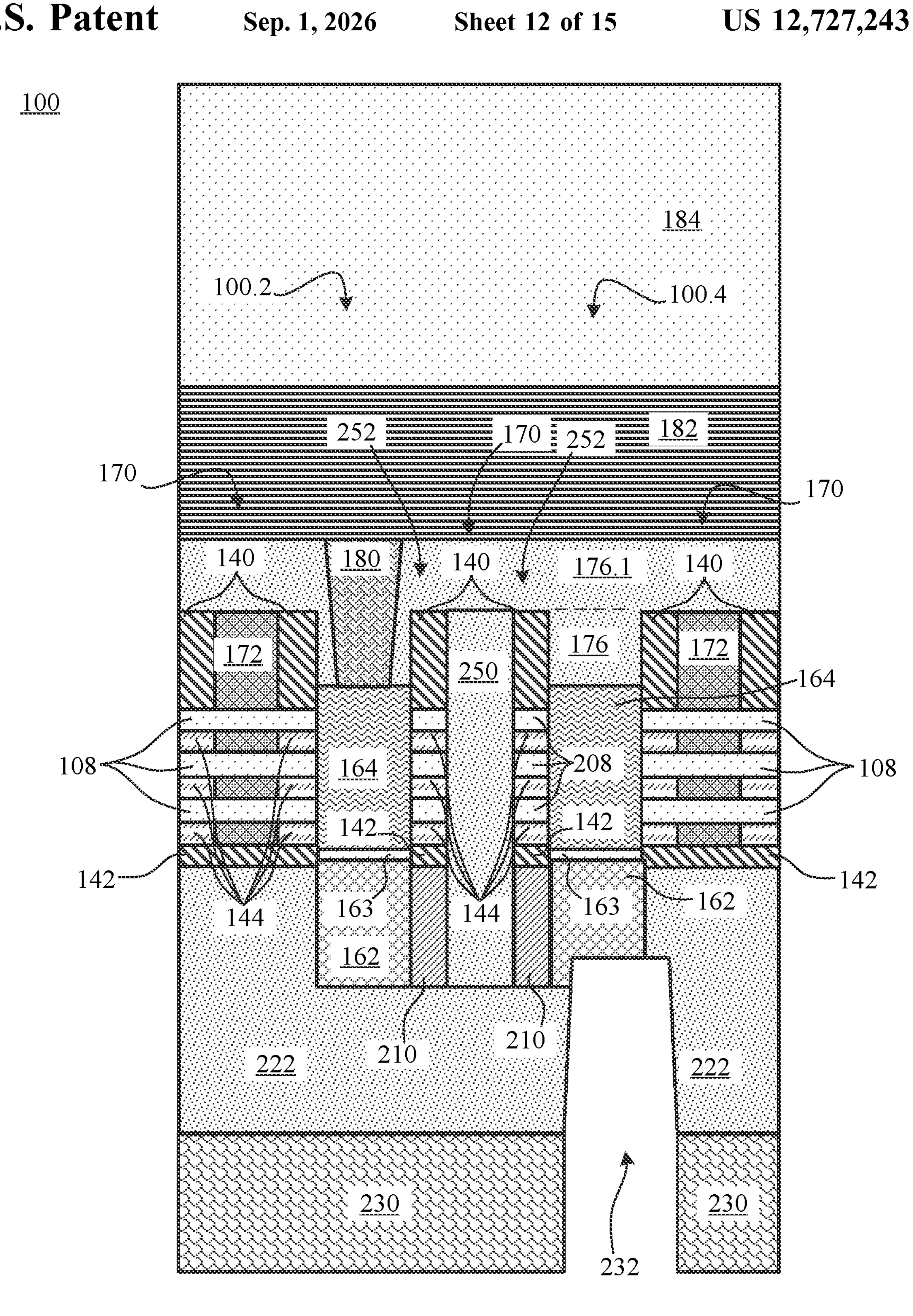

FIG. 12 depicts cross-sectional views of semiconductor IC device 100 shown after illustrative fabrication operation(s), in accordance with one or more embodiments. In the depicted fabrication stage, backside contact opening(s) 232 may be formed. The backside contact opening(s) 232 may be formed by the same or shared lithography and etch process(es), or sequential lithography and etch processes. In such process(es), a mask 230 may be applied to the backside of the semiconductor IC device 100 and patterned. Openings in the patterned mask 230 may sequentially expose the portion(s) of the underlying STI region(s), expose the backside ILD 222, expose the underlying backside contact placeholder 162 that are to be removed while other protected portions of semiconductor IC device 100 may be protected and retained.

The backside contact opening(s) 232 may be formed to expose the associated backside contact placeholder 162 there above (e.g., the backside contact placeholder 162 that is below a S/D region 164 that is not connected to the frontside BEOL network 182).

FIG. 13 depicts cross-sectional views of semiconductor IC device 100 shown after illustrative fabrication operation(s), in accordance with one or more embodiments. In the depicted fabrication stage, the exposed backside contact placeholder(s) 162 and associated etch stop layer 103 (if present) may be removed.

The backside contact placeholder(s) 162 that are exposed by respective backside contact opening(s) 232 may be removed by a substrative removal technique, such as an etch. In one example, the applicable contact placeholder(s) 162 and etch stop layer 163 associated therewith may be removed. In another example, the applicable contact placeholder(s) 162 is removed using the etch stop layer 163 as an etch stop to protect the S/D region 164 there above. Optionally, the exposed S/D region(s) 164 may be at least partially gouged such that a portion of the expose S/D region 164 is removed by a subtractive removal technique, such as an etch.

Figure 14:
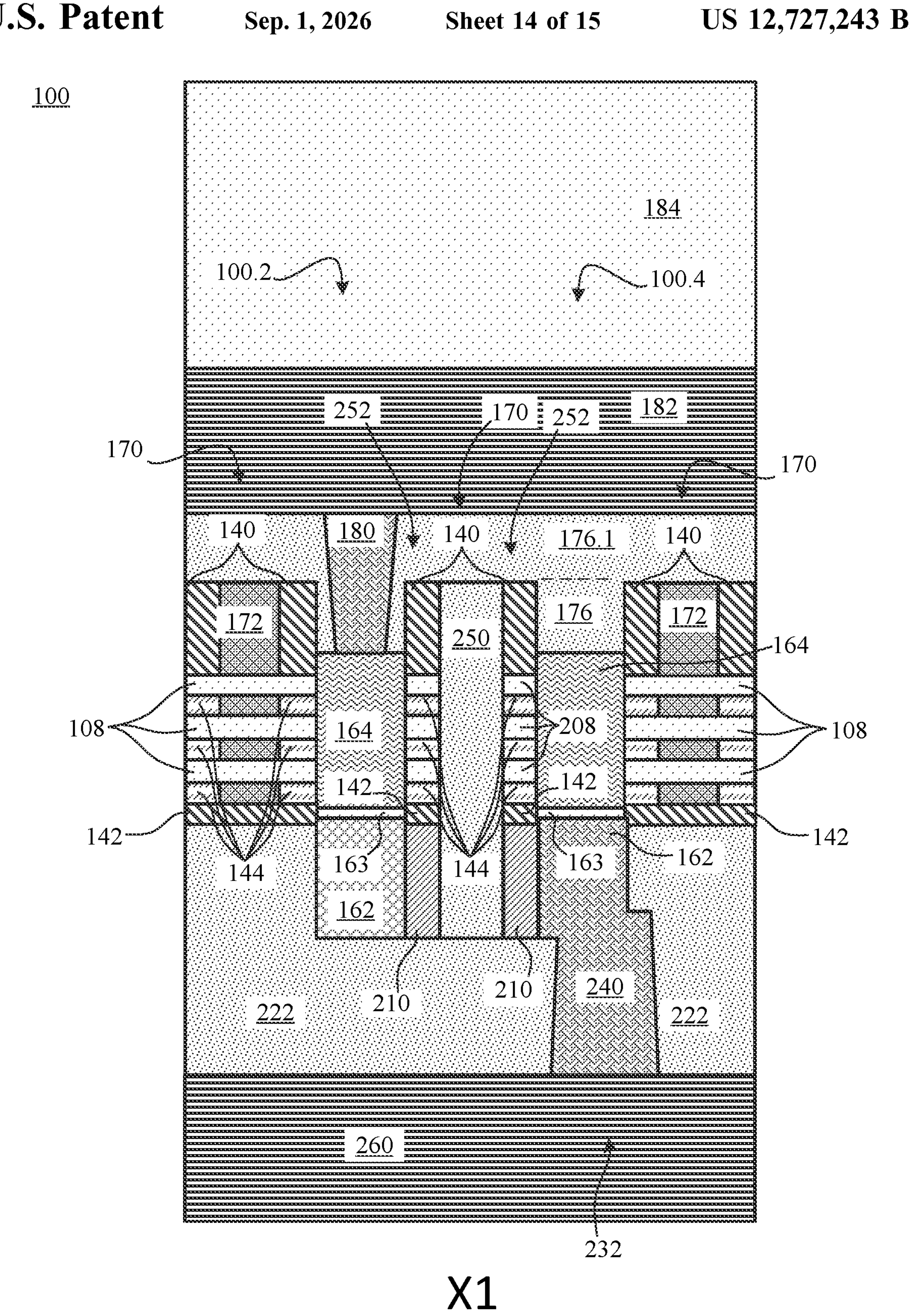

FIG. 14 depicts cross-sectional views of semiconductor IC device 100 shown after illustrative fabrication operation(s), in accordance with one or more embodiments. In the depicted fabrication stage, backside contact 240 may be formed within a respective backside contact opening. Further in the depicted fabrication stage, a planarization process, such as a CMP process or a mechanical grinding process, may remove excess portions of the backside contact(s) 240, may remove excess portions of STI region(s), may remove excess portions of backside ILD 204, and the like. Further in the depicted fabrication stage, a backside BEOL network 260 may be formed.

Respective backside contact(s) 240 may be formed within a respective backside contact opening 232 by depositing conductive material, such as metal, therein. In an example, backside contact(s) 240 may be simultaneously formed by depositing a liner, such as Ni, NiPt or Ti, etc. onto the backside of semiconductor IC device 100 and into the backside contact openings, depositing an adhesion liner, such as TiN, TaN, etc. upon the liner, and by depositing a conductive fill, such as Al, Ru, W, Co, Cu, etc. upon the adhesion liner.

Subsequently, a planarization process, such as a CMP, may expose a bottom surface of the backside ILD 222. As a result, the respective bottom surfaces of backside contact(s) 240 and backside ILD 222 may be substantially horizontal and/or substantially coplanar.

The backside BEOL network 260, such as a backside power distribution network (BSPDN) may be formed upon the backside contact(s) 240 and upon the backside ILD 222. The backside BEOL network 260 may include signal wires for signal routing and power wires for providing power potential (e.g., VDD, VSS, etc.). The backside BEOL network 260 may allow for the distribution of power wires and signal wires between both the frontside and backside of the semiconductor IC device. The backside BEOL network 260 may further allow for the full or partial decoupling of signal routing and/or power routing and/or allows for dividing or splitting power wires and/or signal wires between both the frontside and backside of the semiconductor IC device. By incorporating the backside BEOL network 260, routing congestion may be reduced, which may lead to further semiconductor IC device 100 scaling. For example, semiconductor IC devices that incorporate a backside BEOL network can result in a 30% area reduction and improved current-resistance (IR) drop compared to typical semiconductor IC devices that include solely a frontside BEOL network.

The backside BEOL network 260 may be indirectly electrically and/or indirectly physically connected to the one or more S/D regions 164 by way of a particular backside contact 240. For example, a first backside wire within the backside BEOL network 260 may be electrically connected the backside contact 240 of transistor 100.4, a second backside wire within the backside BEOL network 260 may be electrically connected to backside contact 240 of transistor 100.8, or the like.

The backside BEOL network 260 can include one or more interconnect dielectric material layers and contains backside conductive wires and/or interconnects, such as VIAs, embedded therein. In some embodiments, the backside wires within the backside BEOL network 260 are composed of Cu. The backside BEOL network 260 can include "x" numbers of backside metal levels, wherein "x" is an integer starting from 1. If not included in frontside BEOL network 182, backside BEOL network 260 may further contain conductive pads that are connected to one or more of the backside metal wires and may be used to connect the semiconductor IC device 100 to the external and/or higher-level structure.

In an example, signal routing and power routing is effectively split between the frontside BEOL network 182 and the backside BEOL network 260. For example, at least 90% of the frontside metal wires (e.g., furthest from the transistors 100.2, 100.4, 100.6, and 100.8) are signal routing metal wires and the remainder frontside metal wires which are usually present in metal levels closest to the transistors, can be used as power routing wires. Further in this example, at least 90% of the backside metal wires that are in metal levels closest to the backside contacts are power routing metal wires and the remainder backside metal wires which are usually present in metal levels furthest away from the backside contacts, can be used as signal routing wires. Power routing wires may be less dense than signal routing wires. A signal routing wire is defined herein as a conductive feature, such as a wire, interconnect, or the like, that is configured to electrically carry a functional or logical potential or signal that is to change or is otherwise dynamic over time. A power routing wire is defined herein as a conductive feature, such as a wire, trace, plane, or the like, that is configured to electrically carry power potential. For example, a power routing wire carries or otherwise has a functional power potential, such as VDD, VSS, or the like. For clarity, in some examples, the backside BEOL network 260 may be a backside power distribution network (BSPDN).

The backside BEOL network 260 includes various wiring levels. The wiring levels may alternate between a VIA level and a metal level. To form a VIA level, an associated dielectric passivation layer may be formed, the dielectric passivation layer may be patterned to create a VIA opening therein, and conductive or metal material may be deposited within the VIA opening to form a via contact.

To form a metal level, an associated dielectric layer may be formed, the dielectric layer may be patterned to create a wiring trench therein, and conductive or metal material may be deposited within the wiring trench to form a wire and/or a VIA. A wire, such as within a lowest metal level may connect directly to the backside contact(s).

Semiconductor IC device 100 may be an integrated circuit (IC) chip. IC chips can be distributed by the fabricator in raw wafer form (that is, as a single wafer that has multiple unpackaged chips), as a bare die, or in a packaged form. In the latter case, the IC chip may mount in a single chip package (such as a plastic carrier, with leads that are affixed to a motherboard or other higher-level carrier) or in a multichip package (such as a ceramic carrier that has either or both surface interconnections or buried interconnections). In any case, the IC chip may be integrated with other chips, discrete circuit elements, and/or other signal processing devices as part of either (a) an intermediate product, such as a motherboard, or (b) an end product. The end product can be any product that includes the IC chip, ranging from toys and other low-end applications to advanced computer products having a display, a keyboard or other input device, and a central processor.

Figure 15:
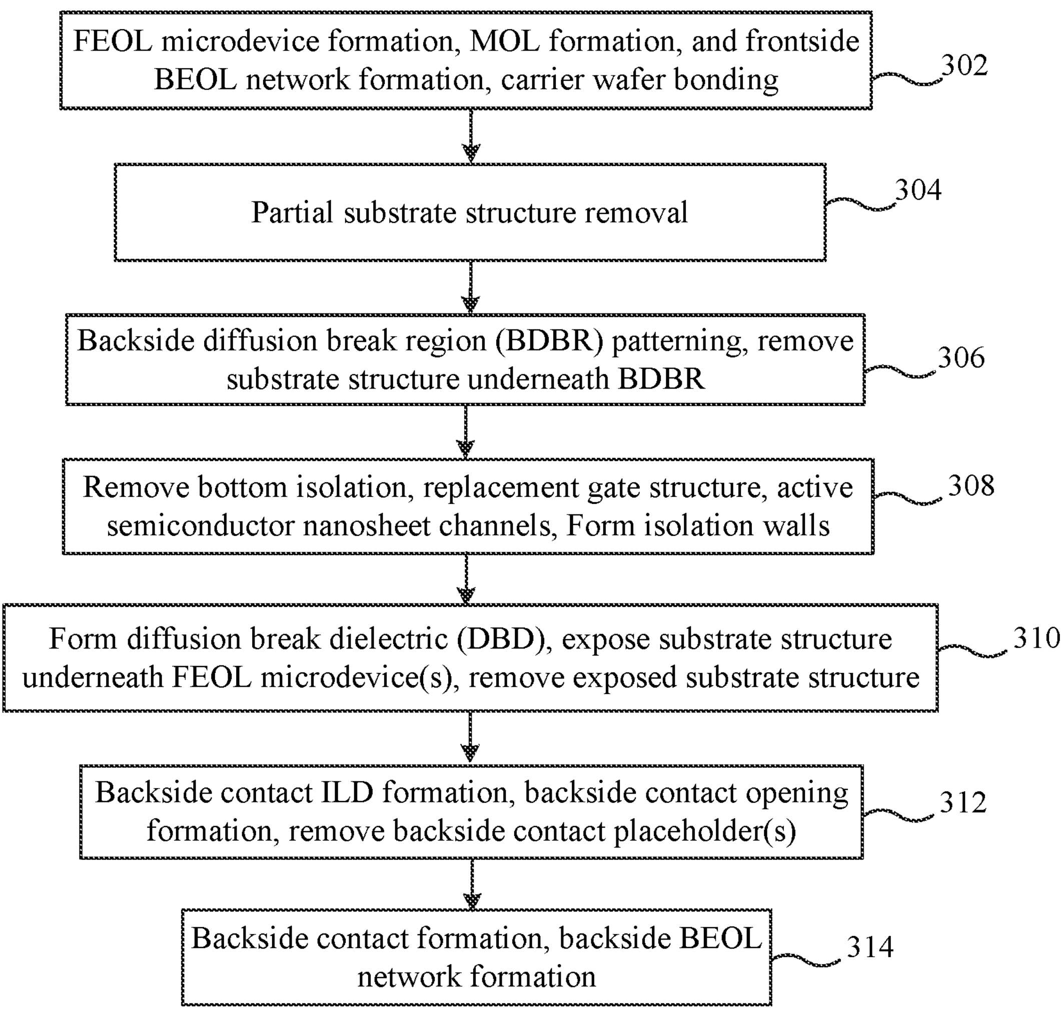
FIG. 15 depicts a method of fabricating a semiconductor IC device that includes a diffusion break region that includes a diffusion break dielectric adjacent to and/or between diffusion break isolation wall(s), according to one or more embodiments of the disclosure.

FIG. 15 depicts a flow diagram illustrating a method 300 to fabricate a semiconductor IC device, such as semiconductor IC device 100. The depicted fabrication operations of method 300 are illustratively depicted and described above with reference to one or more of FIG. 4 through FIG. 14 of the drawings, which describe the fabrication of semiconductor IC device 100, though the fabrication operations described in method 300 may be used to fabricate other types of semiconductor IC devices. The method 300 depicted herein is illustrative. There can be many variations to the diagram or operations described therein without departing from the spirit of the embodiments. For instance, the operations can be performed in a differing order, or operations can be added, deleted, or modified.

At block 302, method 300 may begin with forming one or more front end of line (FEOL) microdevices, such as transistors, with forming middle of line (MOL) structures, such as frontside contact(s), with forming a frontside back end of line (BEOL) network, and with attaching a carrier wafer thereto. For example, one or more transistors, such as transistors 100.2, 100.4, 100.6, and 100.8 are formed, one or more frontside contacts 180 are formed that may contact components or regions (such as S/D regions 164, replacement gate structures 170, etc.), the frontside BEOL network 182 is formed upon the one or more frontside contacts, and a carrier wafer 184 is bonded to the frontside BEOL network 182.

At block 304, the semiconductor IC device may be flipped, and a substrate associated with the FEOL microdevices may be partially removed. For example, the lower substrate 101 of the substrate structure and the etch stop layer 103 of the substrate structure may be removed.

At block 306, method 300 may continue with backside diffusion break region patterning and with removing the upper substrate of the substrate structure that is exposed by the BDBR. For example, mask 200 may be applied to the backside of semiconductor IC device 100 and patterned. A portion of the mask 200 may be removed that exposes the upper substrate 102 in the backside diffusion break region. Subsequently, a substrative removal technique may remove the exposed upper substrate 102 in the backside diffusion break region. The exposed upper substrate 102 within the backside diffusion break region may be located between adjacent backside contact placeholders 162 and may be further located below the replacement gate structure 170 and/or gate spacer 140, inner spacers 144 associated therewith.

At block 308, method 300 may continue with removing the bottom isolation 142 (if present), with removing the replacement gate structure 170, and with removing the active semiconductor nanosheet channels. At block 308, method 300 may also include forming diffusion break isolation walls. For example, the backside diffusion break opening 202 is enlarged by removing the bottom isolation 142, the replacement gate structure 170, and the active semiconductor nanolayers 108 within the backside diffusion break region. Upon the removal of bottom isolation 142, the replacement gate structure 170, and the active semiconductor nanolayers 108, diffusion break isolation walls 252 may be resultantly formed.

At block 310, method 300 may continue with forming a diffusion break dielectric within the backside diffusion break region, with exposing the substrate structure that is located underneath the FEOL microdevice(s), and with removing the exposed substrate structure. For example, diffusion break dielectric 250 is formed by depositing a dielectric material within backside diffusion break opening 202. Subsequently, the upper substrate 102 that is located under the replacement gate structure 170 of transistor 100.2 and/or under the replacement gate structure 170 of transistor 100.4 is exposed and subsequently removed.

At block 312, method 300 may continue with forming a backside ILD and forming backside contact openings within the backside ILD. For example, the backside ILD 222 may be deposited over the backside placeholders 162, over STI region(s), or the like. Then, backside contact openings, such as backside contact openings 232, may be formed within the backside ILD 222 to expose associated backside contact placeholders 162. At block 312, method 300 may further continue with removing the exposed backside contact placeholders. For example, the backside contact placeholders 162 may be removed.

At block 314, method 300 may further continue with forming a backside contact within a respective backside contact opening and with forming a backside BEOL network over the backside contacts. For example, a backside contact 240 may be formed within backside contact opening(s) 232. Subsequently, a CMP process may remove excess backside contact material and a backside BEOL network 260 may be formed upon the planarized backside of semiconductor IC device 100.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor integrated circuit (IC) device comprising:

a first diffusion break isolation wall comprising a first backside spacer, a first bottom isolation region directly upon the first backside spacer, a first alternating series of residual nanolayer channel layers and residual inner spacers directly upon the first bottom isolation region, and a first gate spacer directly upon the first alternating series of residual nanolayer channel layers and residual inner spacers; and a diffusion break dielectric directly against an outer sidewall of the first diffusion break isolation wall.

2. The semiconductor IC device of claim 1, wherein the first backside spacer is directly against a sidewall of a backside contact placeholder.

3. The semiconductor IC device of claim 2, wherein a bottom surface of the first backside spacer is substantially coplanar with a bottom surface of the backside contact placeholder.

4. The semiconductor IC device of claim 3, wherein an inner sidewall of the first diffusion break isolation wall is directly against a sidewall of a source/drain (S/D) region.

5. The semiconductor IC device of claim 1, wherein a bottom surface of the S/D region is directly against a top surface of the backside contact placeholder.

6. The semiconductor IC device of claim 5, wherein charge carriers do not flow through the residual nanolayer channel layers.

7. The semiconductor IC device of claim 6, further comprising:

a frontside interlayer dielectric (ILD) upon the S/D region, upon the first gate spacer, and upon the diffusion break dielectric; and a backside ILD upon the backside contact placeholder, upon the first backside spacer, and upon the diffusion break dielectric.

8. The semiconductor IC device of claim 7, wherein the backside ILD and the diffusion break dielectric are composed of a same first dielectric material.

9. The semiconductor IC device of claim 8, wherein the frontside ILD is composed of a second dielectric material different from the first dielectric material.

10. The semiconductor IC device of claim 1, further comprising:

a second diffusion break isolation wall comprising a second backside spacer, a second bottom isolation region directly upon the second backside spacer, a second alternating series of residual nanolayer channel layers and residual inner spacers directly upon the second bottom isolation region, and a second gate spacer directly upon the alternating series of residual nanolayer channel layers and residual inner spacers; and wherein the diffusion break dielectric is further directly against an outer sidewall of the second diffusion break isolation wall.

11. The semiconductor IC device of claim 10, wherein a dimension between a bottom surface of the first backside spacer and a bottom surface of the second backside spacer is substantially the same as a dimension between a top surface of the first gate spacer and a top surface of the second gate spacer.

12. The semiconductor IC device of claim 1, wherein the first backside spacer is directly against a sidewall of a backside contact.

13. A semiconductor integrated circuit (IC) device comprising:

a first diffusion break isolation wall comprising a first backside spacer, a first alternating series of residual nanolayer channel layers and residual inner spacers directly upon the backside spacer, and a first gate spacer directly upon the first alternating series of residual nanolayer channel layers and residual inner spacers; and a diffusion break dielectric directly against an outer sidewall of the first diffusion break isolation wall.

14. The semiconductor IC device of claim 13, wherein the first backside spacer is directly against a sidewall of a backside contact placeholder.

15. The semiconductor IC device of claim 14, wherein a bottom surface of the first backside spacer is substantially coplanar with a bottom surface of the backside contact placeholder.

16. The semiconductor IC device of claim 15, wherein an inner sidewall of the first diffusion break isolation wall is directly against a sidewall of a source/drain (S/D) region.

17. The semiconductor IC device of claim 13, further comprising:

a second diffusion break isolation wall comprising a second backside spacer, a second alternating series of residual nanolayer channel layers and residual inner spacers directly upon second backside spacer, and a second gate spacer directly upon the alternating series of residual nanolayer channel layers and residual inner spacers;

and wherein the diffusion break dielectric is further directly against an outer sidewall of the second diffusion break isolation wall.

18. The semiconductor IC device of claim 17, wherein a dimension between a bottom surface of the first backside spacer and a bottom surface of the second backside spacer is substantially the same as a dimension between a top surface of the first gate spacer and a top surface of the second gate spacer.

19. The semiconductor IC device of claim 17, wherein a dimension between a bottom surface of the first backside spacer and a bottom surface of the second backside spacer is greater than a dimension between a top surface of the first gate spacer and a top surface of the second gate spacer.

* * * * *